(12) United States Patent
Schiek

(10) Patent No.: US 7,065,736 B1
(45) Date of Patent: Jun. 20, 2006

(54) SYSTEM FOR GENERATING TWO-DIMENSIONAL MASKS FROM A THREE-DIMENSIONAL MODEL USING TOPOLOGICAL ANALYSIS

(75) Inventor: Richard Schiek, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 336 days.

(21) Appl. No.: 10/671,116

(22) Filed: Sep. 24, 2003

(51) Int. Cl.
G06F 17/50 (2006.01)
(52) U.S. Cl. .......................................... 716/19; 719/21
(58) Field of Classification Search .................. 716/19, 716/21
See application file for complete search history.

(56) References Cited

U.S. PATENT DOCUMENTS

| | | | |
|---|---|---|---|
| 5,903,099 | A | 5/1999 | Johnson et al. |
| 6,074,890 | A | 6/2000 | Yao et al. |
| 6,082,208 | A | 7/2000 | Rodgers et al. |
| 6,277,666 | B1 | 8/2001 | Hays et al. |
| 6,563,106 | B1 | 5/2003 | Bowers et al. |
| 6,567,715 | B1 | 5/2003 | Sinclair et al. |
| 6,574,033 | B1 | 6/2003 | Chui et al. |
| 2002/0086456 | A1 | 7/2002 | Cunningham et al. |
| 2003/0021523 | A1 | 1/2003 | De Natale |
| 2003/0060051 | A1 | 3/2003 | Kretschmann et al. |
| 2003/0062332 | A1 | 4/2003 | Harris et al. |

OTHER PUBLICATIONS

Sungwook, Cho, Development of a Geometry-Based Process Planning System for Surface Micromachining, International Journal of Production Research, 2002, vol. 40/No. 5/MAR, pp. 1275-1293, Institution of Production Engineers.

R. Schiek and R. Schmidt, A New, Topolog Driven Method for Automatic Mask Generation from Three-Dimensional Models, Feb. 23, 2003, Sandia National Laboratory, Computational Sciences Department, Albuquerque, New Mexico.

The National Academy of Sciences, 2 Integrated Circuit Based Fabrication Technologies and Materials, Microelectromechanical Systems: Advanced Materials and Fabrication Methods (1997), pp. 14-22, http://www.nap.edu/openbook/0309059801/html.

Primary Examiner—Sun James Lin
(74) Attorney, Agent, or Firm—Madelynne I Farber

(57) ABSTRACT

A method of generating two-dimensional masks from a three-dimensional model comprises providing a three-dimensional model representing a micro-electro-mechanical structure for manufacture and a description of process mask requirements, reducing the three-dimensional model to a topological description of unique cross sections, and selecting candidate masks from the unique cross sections and the cross section topology. The method further can comprise reconciling the candidate masks based on the process mask requirements description to produce two-dimensional process masks.

32 Claims, 21 Drawing Sheets

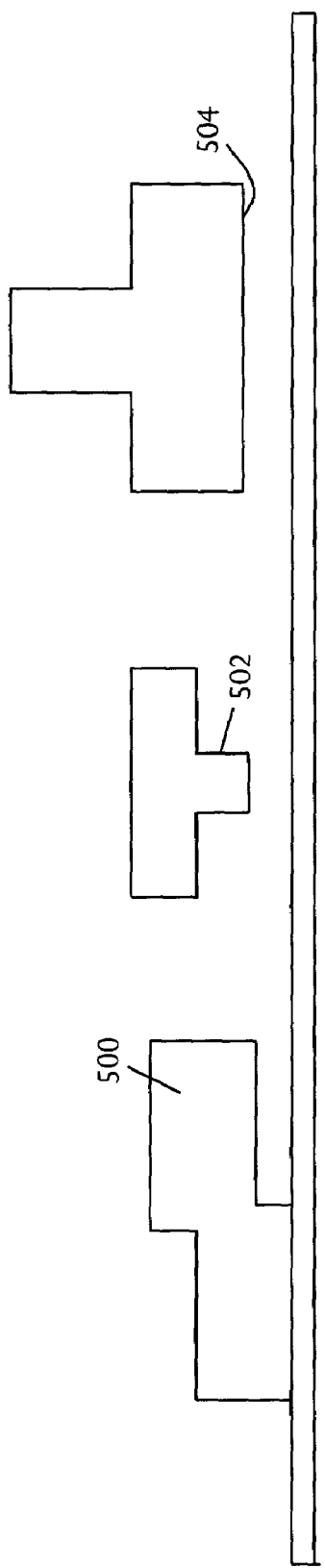

SYSTEM FOR GENERATING TWO-DIMENSIONAL MASKS FROM A THREE-DIMENSIONAL MODEL USING TOPOLOGICAL ANALYSIS

STATEMENT OF GOVERNMENT INTEREST

The invention was developed under Contract DE-AC04-94AL85000 between Sandia Corporation and the U.S. Department of Energy. The U.S. government has certain rights in this invention.

BACKGROUND OF THE INVENTION

Designing a device for production by silicon micromachining is very different from macro-scale mechanical design. In the macro-scale, a designer can create a three-dimensional model of the device that is sufficient for a design program to translate into tool paths for device production. In contrast, for a silicon micromachined device, the designer must create a set of process-specific masks that are used to fabricate the device. Creating the masks is equivalent to requiring the macro-scale designer to design not only the product, but also the tools used to construct the product. Masks are dependent on the process used for fabrication and can have complex interactions within a production system, therefore creation of the masks is a significant challenge to innovative device design and the manufacture of a device on multiple processes.

What is desired is a technique for translating a designer's three-dimensional model of a product directly into the masks used to produce the model.

Previous attempts to create MEMS mask sets have used existing technology in process simulators, for example programs that can simulate fabrication from masks that are supplied with process data for a specific production process. Typically, a trial mask set is used to produce a three-dimensional object that is then compared to the desired object. Differences between the two objects are used to alter the trial mask set. The process is repeated until a mask set is found which correctly produces the desired part. The process is computationally intensive and has been unable yet to produce production masks for complex, multiple-layer surface micromachined devices.

SUMMARY

According to some embodiments, a method of generating two-dimensional masks from a three-dimensional model comprises providing a three-dimensional model representing a micro-electro-mechanical structure for manufacture and a description of process mask requirements, reducing the three-dimensional model to a topological description of unique cross sections, and selecting candidate masks from the unique cross sections and the cross section topology. The method further can comprise reconciling the candidate masks based on the process mask requirements description to produce two-dimensional process masks.

According to other embodiments, a method of generating two-dimensional masks from a three-dimensional model comprises disassembling the three-dimensional model into one or more independent bodies, and processing the individual independent bodies. Processing the individual independent bodies comprises generating a topology tree composed of one or more nodes, categorizing the one or more nodes of the topology tree, and locating deposition boundaries to define one or more deposition domains. The method further comprises processing the individual deposition domains comprising locating candidate masks, and saving masks in a candidate mask set. The method further comprises summing the candidate masks in the candidate mask set.

According to further embodiments, a method of generating two-dimensional masks from a three-dimensional model comprises analyzing cross sectional topology of a three-dimensional body, and generating a topology tree describing connectivity and relationships between cross sections. The topology tree includes one or more nodes and branches connecting the nodes. The method further comprises processing the individual nodes comprising calculating a cross sectional area of the node, and categorizing the node relative to topological neighboring nodes. The method further comprises processing the individual branches comprising locating deposition boundaries to define one or more deposition domains. The method also comprises processing individual deposition domain regions between the deposition boundaries comprising defining a mask set and deposition thickness.

BRIEF DESCRIPTION OF THE DRAWINGS

Embodiments of the invention relating to both structure and method of operation, may best be understood by referring to the following description and accompanying drawings.

FIGS. 5A, 5B, and 5C are schematic pictorial diagrams showing examples of topologically distinct structures.

DETAILED DESCRIPTION

Beginning with a three-dimensional model of an object, what is desired is an accurate, efficient, and flexible technique for deriving a two-dimensional mask set that can be used to manufacture the object in a surface micromachining process. The design of a surface micromachined micro-electro-mechanical systems (MEMS) device can efficiently employ a process independent mask set that describes various layers of material and the combination of the layers to construct the device. The technique illustrated herein uses inferences from the cross-sectional topology of a three-dimensional model to create masks for fabricating the device. The inferred masks are general in nature and can be fitted to a specific production process using information describing the process mask constraints. The described system enables a MEMS designer to focus on creation of a three-dimensional model of a desired device, rather than the masks used to fabricate the device in a specific production process.

Figure 1:
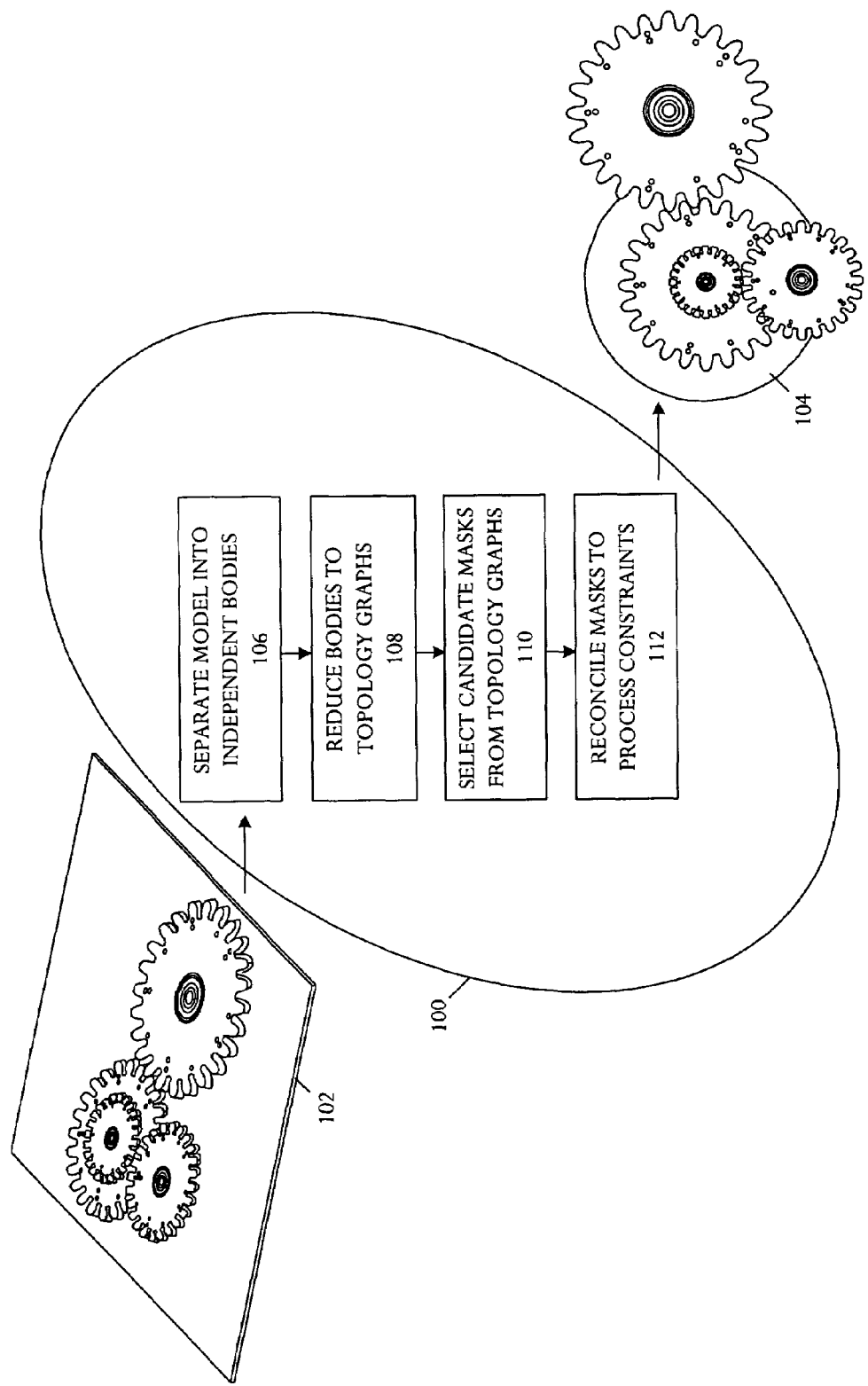
FIG. 1 is a schematic mixed pictorial diagram and flow chart showing a flow model of a process for generating two-dimensional masks from a three-dimensional model.

Referring to FIG. 1, a schematic mixed pictorial diagram and flow chart shows a flow model of a process 100 for generating two-dimensional masks 104 from a three-dimensional model 102. The process or method 100 generally comprises the actions of providing a three-dimensional model 102 representing a micro-electro-mechanical structure for manufacture and a description of process mask requirements, and reducing the three-dimensional model to a topological description of unique cross sections, called a topology graph 108. With the topology information available, the method comprises selecting candidate masks from the unique cross sections and the cross section topology 110 in the topology graph structure. Given a description of a process mask requirements, the candidate masks are reconciled the mask constraints description to produce true two-dimensional process masks 112.

For a three-dimensional model 102 that includes multiple structures, the method can include the action of separating the three-dimensional model into at least one independent model bodies 104.

The illustrative process 100 simplifies surface micromachining design, enabling a designer to create the three-dimensional model 104 in a traditional Computer Aided Design (CAD) environment.

In some embodiments, the action of reconciling the masks to predetermined process constraints 112 can be eliminated. If a model cannot be produced within constraints of a particular process or a particular process is not specified, a technique for defining the process steps that could be used to produce the model can be useful. For example, if a three-dimensional model is supplied and a specific manufacturing process for production of a part corresponding to the model is not defined, then the method can produce two-dimensional masks as well as a process description for a manufacturing process capable of producing the device.

Figure 2A:
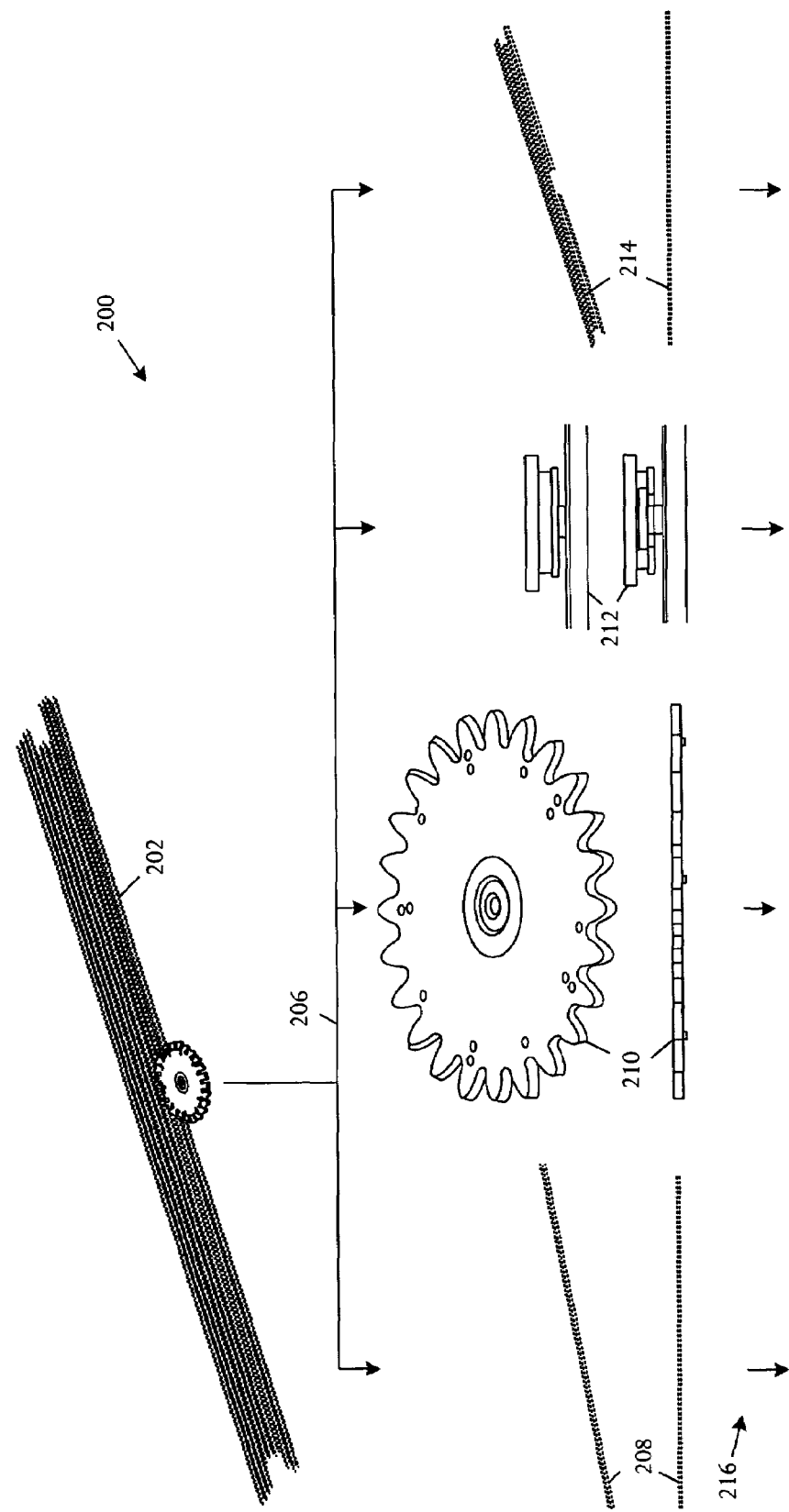
FIGS. 2A and 2B constitute a schematic pictorial flow diagram illustrating additional detail of a process or method for generating two-dimensional masks from a three-dimensional model.
Figure 2B:
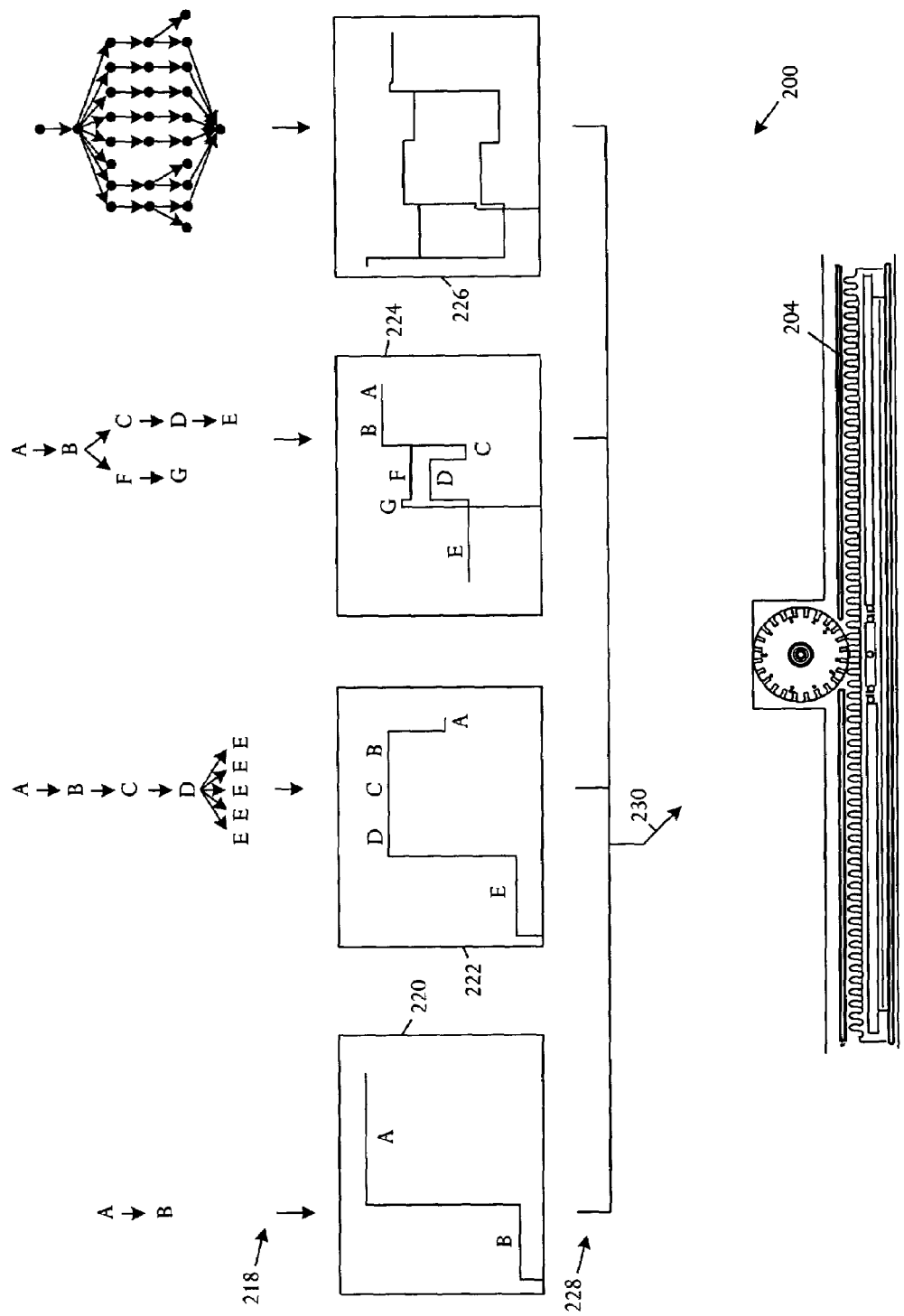

Referring to FIGS. 2A and 2B, a schematic pictorial flow diagram shows additional detail of a process or method 200 for generating two-dimensional masks 204 from a three-dimensional model 202. The model is separated 206 into independent bodies, in the illustrative example a rack 208, a gear 210, a hub 212, and a rack restraint 214. The independent bodies are depicted in perspective and side views. Independence of the bodies is defined as a condition in which the bodies do not intersect, are constructed of different materials, or are topologically related at only one point.

Each independent body is searched for unique cross sections 216. The cross-sections are arranged in a tree with one or more nodes based on the mutual topological relationship between the sections.

Topology trees or graphs are analyzed 218 by calculating area for each node and categorizing the node relative to the node's topological neighbors. Simple heuristic rules are used to identify masks. For example, local maxima typically identify masks for structural material such as polysilicon (Poly). The topological neighborhood can influence the heuristic selection process, although what is typically sought is a general mask set that can be used to build the particular body. The results of the analysis are cross-sectional area and topology graphs for the rack 220, the gear 222, the hub 224, and the rack restraint 226.

The analysis also includes selecting candidate masks based on structure of the topology graphs. Masks are summed 228 from the individual topological analyses. The mask set is reconciled with process constraints 230 to create production masks. Reconciliation ensures that the correct number and type of masks are used. Reconciliation converts a general and non-optimal mask set that results from topology tree analysis into a mask set that is tuned for usage in an actual production process. Mask reconciliation includes processes such as reordering, merging, and splitting the summed candidate masks and is based on criteria such as number of layers, material type of a layer, thickness of a layer, and number of masks.

Figure 3:
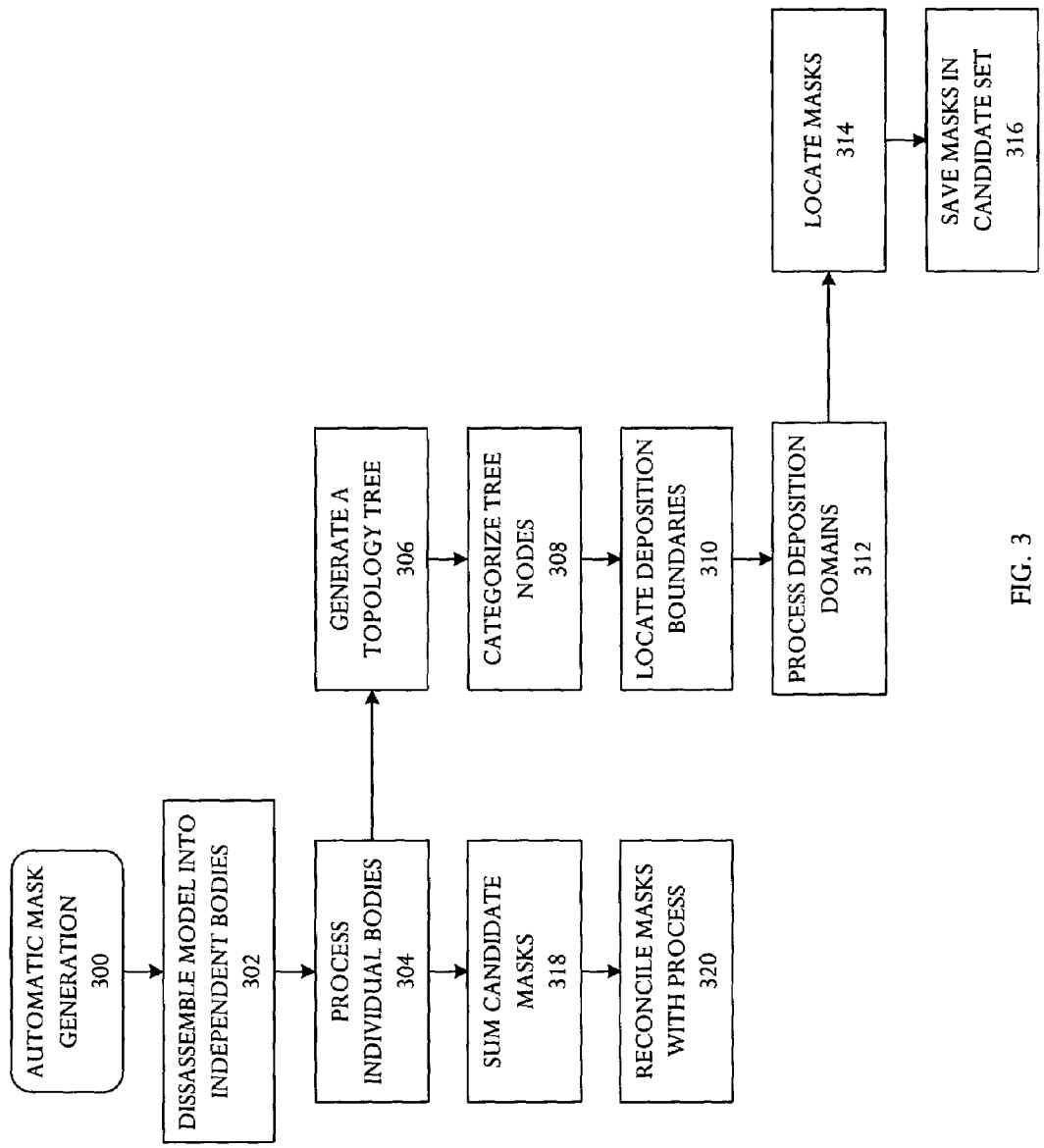
FIG. 3 is a flow chart that depicts an embodiment of a method for generating two-dimensional masks from a three-dimensional model.

Referring to FIG. 3, a flow chart depicts an embodiment of a method for generating two-dimensional masks from a three-dimensional model 300. The method 300 comprises the actions of disassembling the three-dimensional model into one or more independent bodies 302, and processing the individual independent bodies 304. For the processing of the individual independent bodies 304 the actions comprise generating a topology tree composed of one or more nodes 306, categorizing the nodes of the topology tree 308, and locating deposition boundaries to define one or more deposition domains 310. The method 300 further comprises processing the individual deposition domains 312. For the individual processing domains, the method 300 comprises locating candidate masks 314, and saving the candidate masks in a candidate mask set 316. The candidate masks in the candidate mask set are summed 318.

A three-dimensional body typically will be composed of many independent bodies. Most efficiently, the method 300 operates upon the independent bodies separately. Accordingly, in some embodiments and applications, an initial action divides the object into constituent non-intersecting, independent components. The method 300 compensates for the division into separate bodies by summing the candidate masks 318 following decomposition and analysis. Summation is straightforward since the independent bodies have non-overlapping masks in a topological sense.

The illustrative method 300 is an analytical approach to fabrication of micro-electro-mechanical (MEMs) structures, for example for surface micromachining of complex devices. Generation of the topology tree 306 for the individual independent bodies involves analysis of cross-sections of the three-dimensional model. The analysis most particularly focuses on three aspects including topology, equivalency, and area.

Figure 4A:
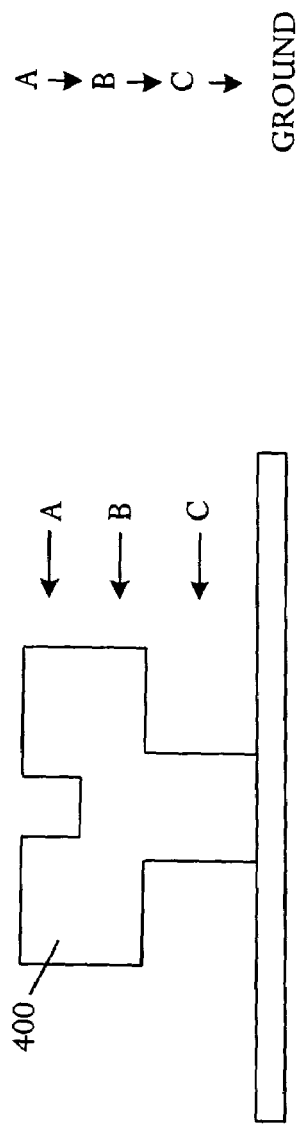
FIGS. 4A and 4B are schematic pictorial diagrams showing a part that is used as an example for a simple analysis of topology tree generation.
Figure 4B:
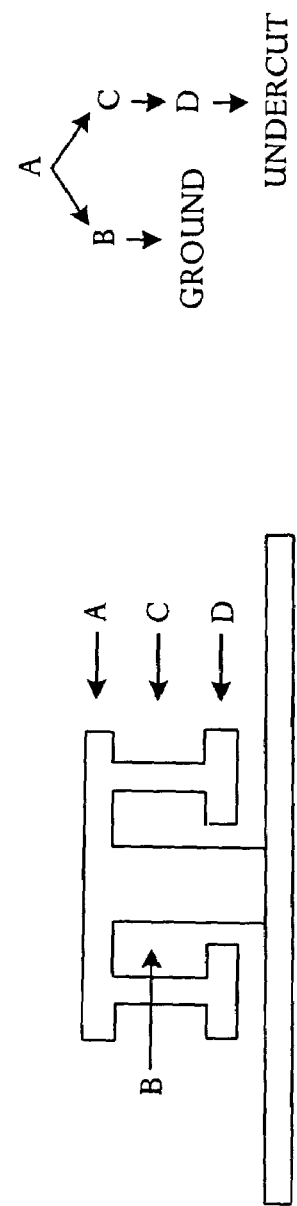

The cross-sectional topology describes the connectivity or relationship between the various cross sections. With etching and deposition processes, structures are logically analyzed in terms of horizontal cross sections and associated topology. FIGS. 4A and 4B are schematic pictorial diagrams showing a part that is used as an example for a simple analysis of topology tree generation. Referring to FIG. 4A, a schematic pictorial diagram shows a part 400 that is used as an example for a simple analysis of topology tree generation. For the illustrative part 400, the cross section of the top section A has two segments separated by an interior void. The cross section of the middle section B is constant and extends between the level of top section A and the level at which section B connects to the cross section of the bottom post C. The bottom post C connects to a silicon substrate, termed ground. With the cross section of the top sections represented as A, the cross section of the middle represented as B, and the cross section of the bottom post termed C, then the topology of the object is simply A connected to B connected to C which connects to ground (A→B→C→ground). The structure, A→B→C→ground, is called a topology tree or topology graph, and A, B, and C are nodes on the tree or graph.

Equivalency describes the similarity of cross sections taken at any position along the vertical axis. For example, each of cross sections A, B, and C includes only horizontal cross-sections at all vertical levels that are identical and equivalent because the intersection and union of any pair of cross sections yields the same cross sections. According each of cross sections A, B, and C is internally equivalent, although cross section A is not equivalent to either of cross sections B or C, and cross section B is not equivalent to cross section C.

Area describes the relative size of a cross sectional segment. The criteria of topology, equivalency, and area are used to infer mask specifications by analysis of the topology trees or graphs.

With the description of a three-dimensional model rendered into a topology tree, the masks for constructing the object are assembled. The cross sectional topology is made free of neighboring masks that are equivalent. Equivalent cross sections are redundant so that removal from the topology simplifies analysis. Referring again to FIG. 3, nodes of the topology tree are categorized 308. Masks are identified from a topology tree based on a node's cross sectional area in relation to the area of a neighboring node. For topologically-connected cross sections A, B, and C in the tree A→B→C and the notation area[x] denoting the area of cross section, then Table I shows heuristics that can be used to categorize topology tree nodes:

TABLE I

| Relationship | Node Category |
| --- | --- |
| area[A] > area[B] < area[C] | B is a local minimum |
| area[A] < area[B] > area[C] | B is a local maximum |
| area[A] > area[B] and area[C] = 0 | B is an ending minimum |
| area[A] < area[B] and area[C] = 0 | B is an ending maximum |
| Area[A] < area[B] < area[C] or area[A] > area[B] > area[C] | B is a connection |

The topology trees can be simplified for redundant nodes. The redundant nodes can be joined. Nodes that topologically connect to the same nodes are combined into one node.

After categorizing the nodes, several inferences can be made. All local minima can be considered boundaries between successive layers in a multiple layer process. For example, if two different depositions of polysilicon are used in a particular process, then the local minima in a structure tend to occur where holes are located in an intervening supporting but removable layer, such as a sacrificial oxide layer, to connect the two polysilicon or other structural layers. The characterization is not absolute since two structural layers could alternatively be laminated. If lamination is not used, local minima are typically used to connect different deposition layers.

In the action of locating deposition boundaries to define one or more deposition domains 310, locations of all local minima within a topology tree can be identified and recorded. Local minima locations signify boundaries between different depositions in a manufacturing process. Local minima generally call for a sacrificial oxide (SacOx) mask. In a deposition zone, for example in a region between two deposition boundaries, the local maximum corresponds to the polysilicon mask used for the object.

A deposition zone can contain an ending minimum or maximum, features that uniquely identify special process masks used to produce dimples and undercuts, respectively.

FIG. 4B shows another example of a structure and a topology tree for the structure that includes topologically distinct features including undercuts, dimples, and overlaps that utilize special masks such as PinJoint, Dimple, and special polysilicon (Poly) masks.

Referring to FIGS. 5A, 5B, and 5C, schematic pictorial diagrams show examples of topologically distinct structures. FIG. 5A shows an example of an overlap 500. An overlap is characterized by local maxima with overlapping local minima. The local maxima can be formed using a polysilicon mask. The local minima can be ignored.

FIG. 5B shows an example of a dimple 502. Dimples are small protrusions of polysilicon, typically under a large flat surface that is desired to not connect to a surface below. Dimples prevent adjacent surface adhesion by separating the surfaces and maintaining the separation during release. Dimples are characterized by a local minimum with no lower connecting element. Dimples can be formed using various mask criteria. For example, a dimple cut mask can be used to form the local minima.

FIG. 5C depicts an example of an undercut 504. Undercuts are used for rotating joints such as pin joints and hubs for gears. Undercuts are formed by an isotropic etching step. Undercuts are topologically distinct and are simple to locate. Identification of ending minima and maxima in a topology tree leads directly to identification of dimple and pin joint masks respectively. Undercuts are characterized as a local maximum with no lower connecting element. Particular mask criteria can be inferred by the undercut topology. For example, a pin-joint cut mask can be used for adjoining minima, and a sacrificial oxide mask for the nearest neighbor perimeter. An undercut does not define a deposition boundary.

Referring again to FIG. 3, the candidate masks are summed 318 and the system accounts for process influences. The identifying masks from a topology tree produce a generalized mask set that is typically not optimized for a specific process. The set of candidate masks generated from the topology tree can be reconciled with mask constraints of a selected process 320.

A surface micromachining manufacturing process typically has a fixed order of layer deposition and a fixed thickness on the individual layers. Accordingly, the process expects masks in a predetermined order. The expected process sequence is compared to the sequence of masks in the derived candidate mask set. Some mathematically-allowed operations, such as inverting, dividing, some rearranging, and the like, can be performed on the candidate masks for fitting to a specific process sequence. More specifically, masks can be inverted, for example if a dark field mask is expected where a light field mask is generated. Here, the etching sense of the mask can be inverted. Candidate masks for layers that are thicker than the layers in the specific target process can be split with an additional, identical sacrificial oxide mask placed between the split mask, enabling handling of laminated layers. In another example, ordering of candidate masks can be rearranged if the underlying object result is the same for a relocated mask that is applied later in the process. Rearranged ordering enables specific material masks, such as doped polysilicon, to be moved from the topological placement in the candidate mask set to a more useful and/or pragmatic location in the process mask set.

Adjustments to the candidate masks can be performed with a stepwise optimization sequence. If the optimization process fails to fit masks to the selected process, then the desired product cannot be fabricated in the selected process. Accordingly, the reconciliation action 320 can identify the topological feature causing the problem and communicate the information to a designer or user.

In the illustrative method embodiment, the method 300 does not account for specific process details until reconciliation 320.

Figure 6A:
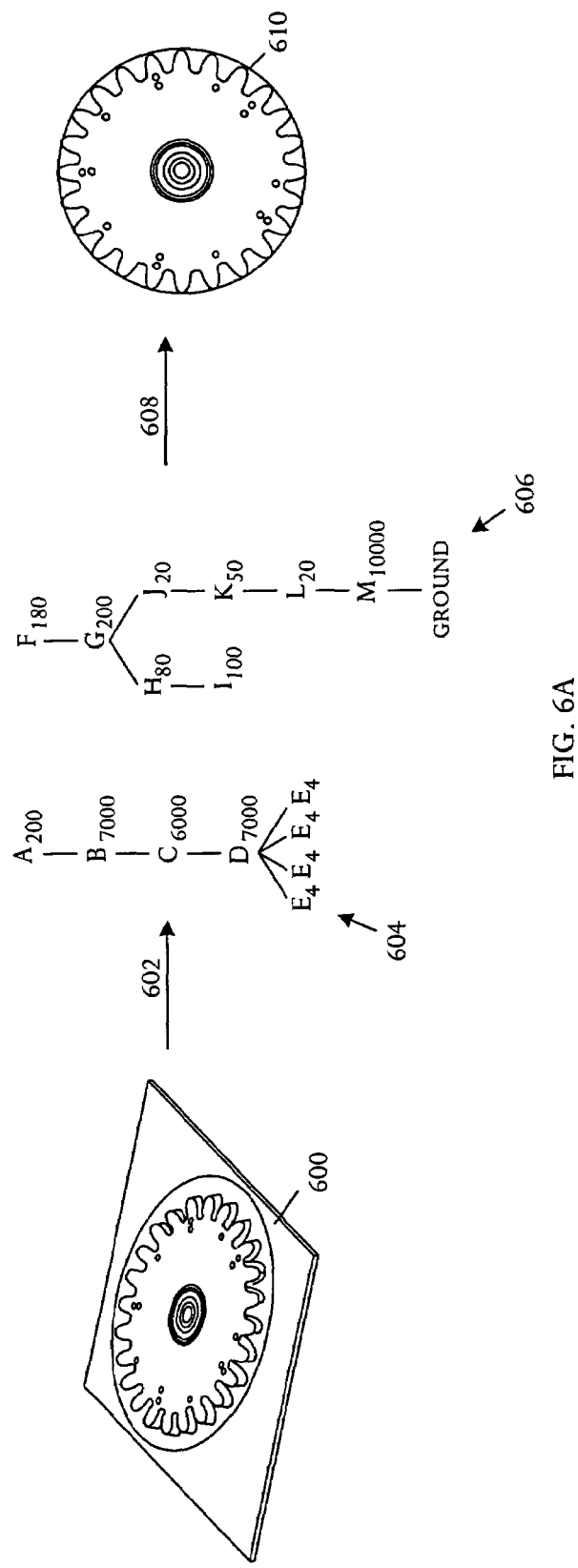
FIGS. 6A through 6H are mixed schematic pictorial and flow diagrams that illustrate an example of application of an automatic mask generation process embodiment.
Figure 6B:
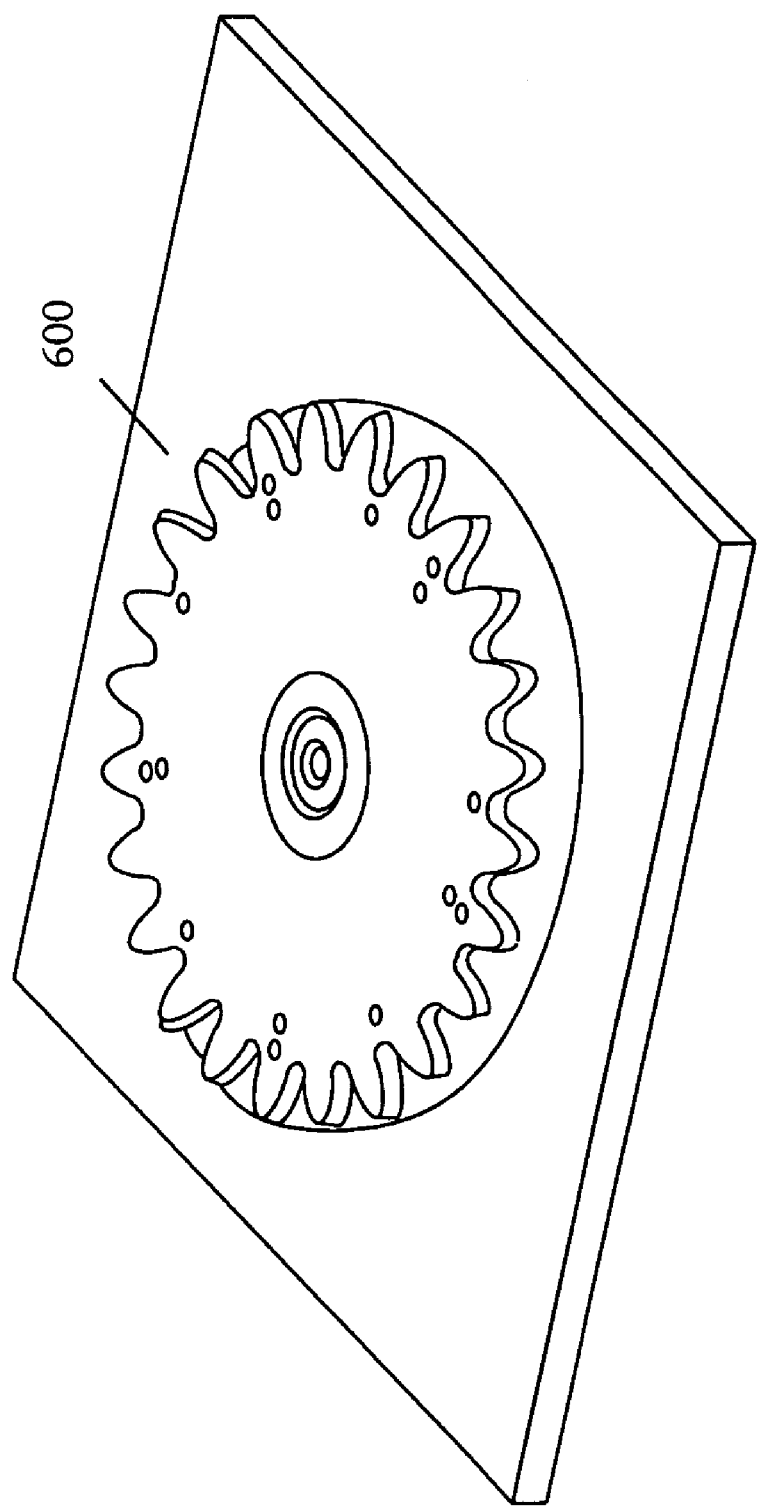

Referring to FIG. 6A, a mixed schematic pictorial and flow diagram illustrates an example of application of an automatic mask generation process embodiment. The illustrative three-dimensional model is a gear and hub on silicon substrate 600. FIG. 6B depicts the gear and hub on silicon substrate model 600 with additional detail. The gear and hub represent two independent bodies so that analysis 602 generates two topology trees, one tree for the gear 604 and one for the hub 606. Nodes for the trees are designated by the letters A through M and subscripts to the nodes are numbers representing the relative area of the node or, in the case of nodes E, the area of each node labeled E.

Figure 6C:
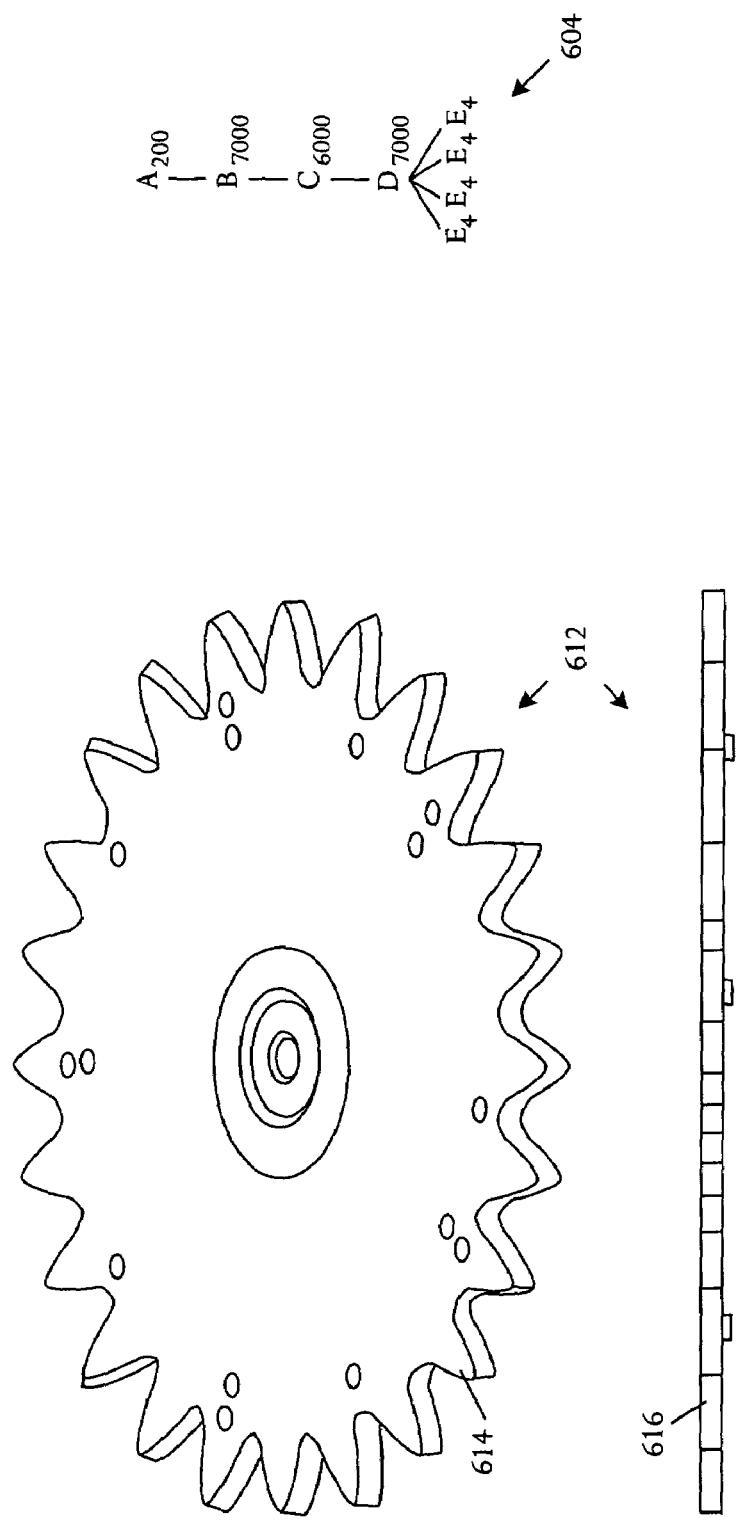
Figure 6D:
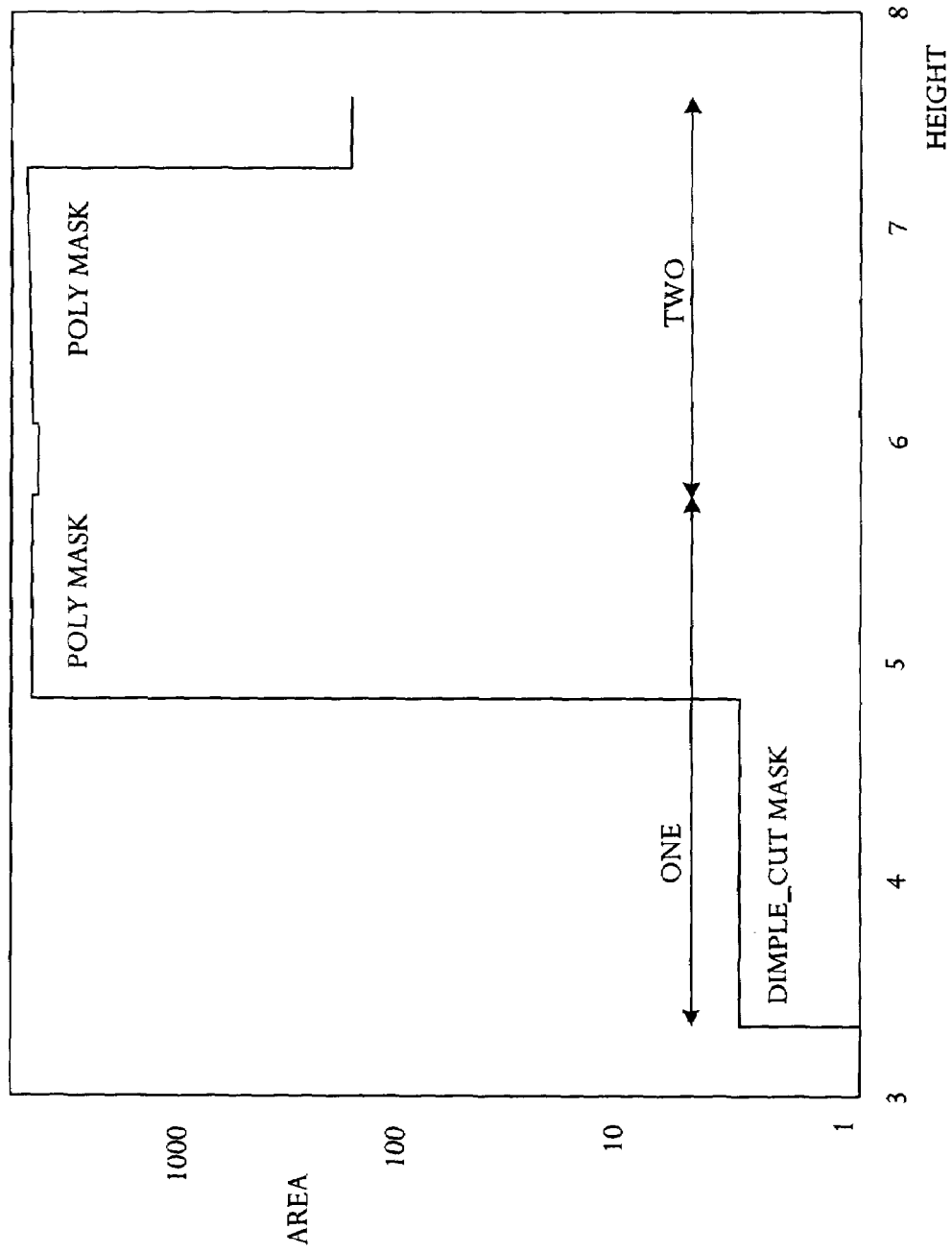
Figure 6E:
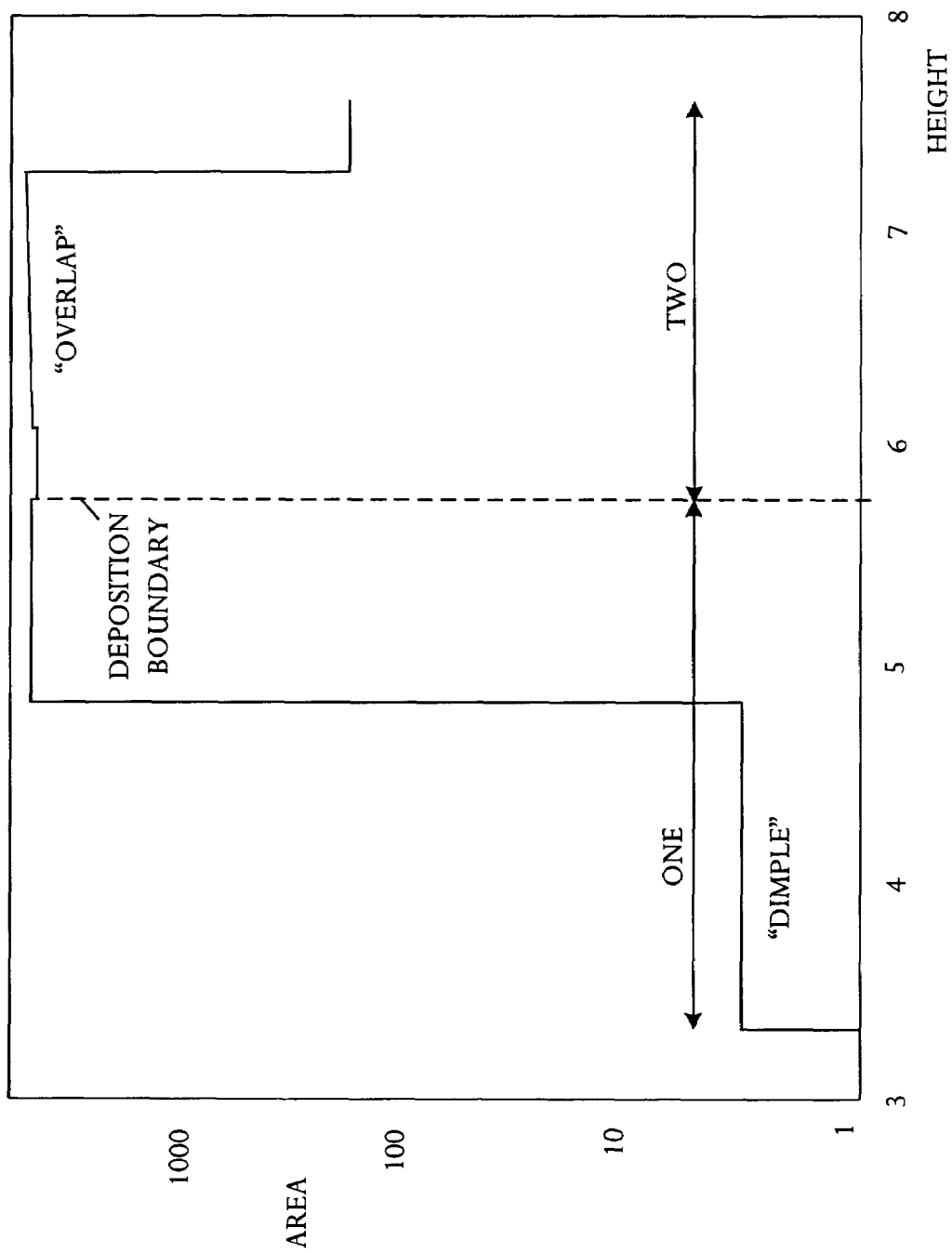

FIG. 6C is a pictorial diagram showing a gear topology 612 in perspective 614 and side 616 views in combination with the gear topology tree 604. The nodes of the gear topology tree 604 are categorized, determining that nodes B and D are local maxima, node C is a local minimum, and nodes E are dimples. Nodes E are redundant, all starting from the same location of node D and all terminating the topology tree. The nodes E can be consolidated into a single node. A candidate mask set for the gear includes two polysilicon masks corresponding to nodes B and D, one sacrificial oxide mask corresponding to node C, and one dimple mask for the consolidated node E. FIG. 6D is a graph showing the cross-sectional area and topology of the gear. Local extremes define the masks. A dimple structure becomes a dimple cut mask. Overlap is generated by one poly mask. The gear has three masks including one dimple cut mask and two poly masks. FIG. 6E is a graph showing the deposition boundaries and domains for the gear. Local minima define the deposition boundaries. The gear has one deposition boundary and two deposition domains, labeled as one and two.

Figure 6F:
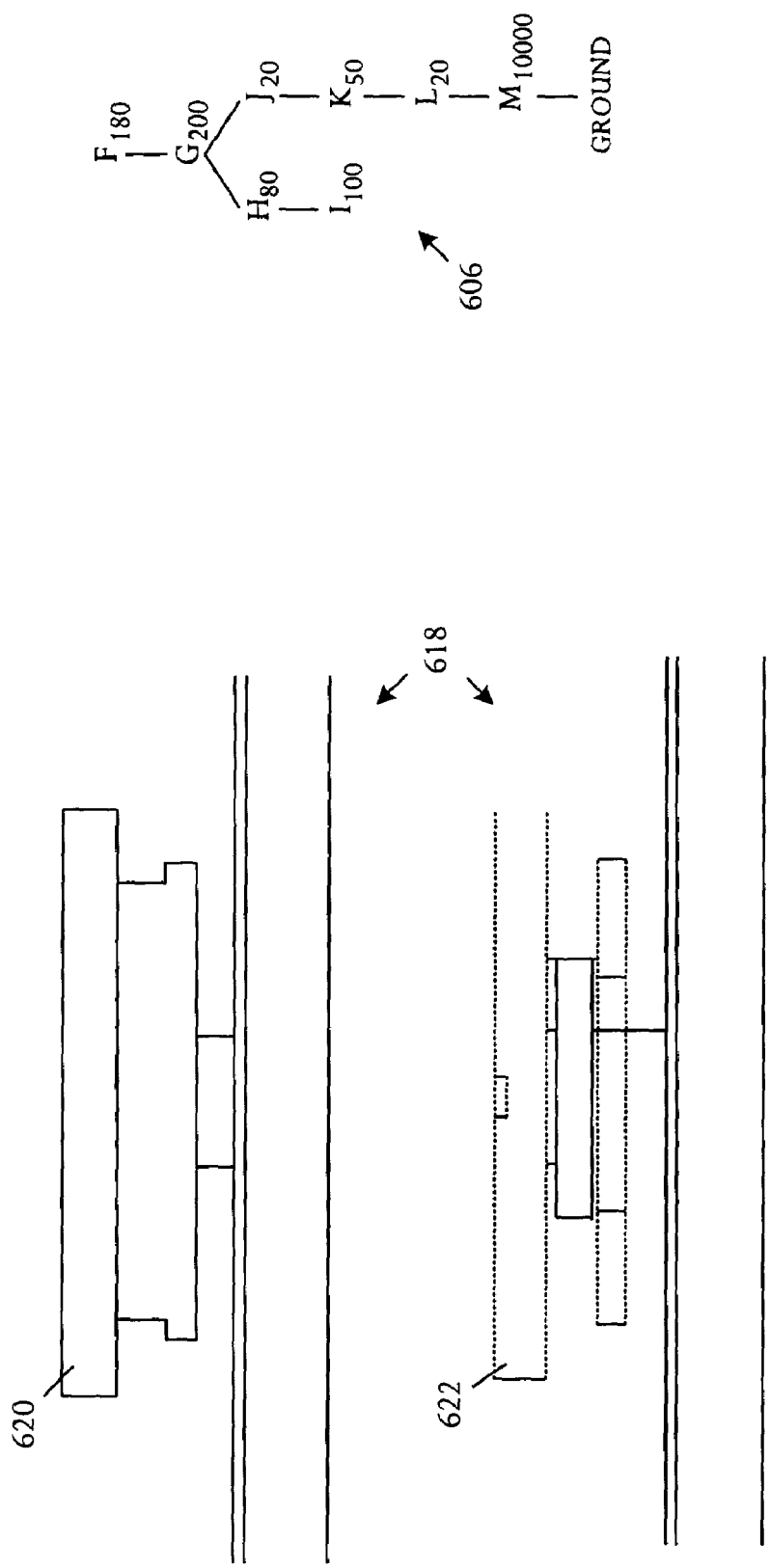
Figure 6G:
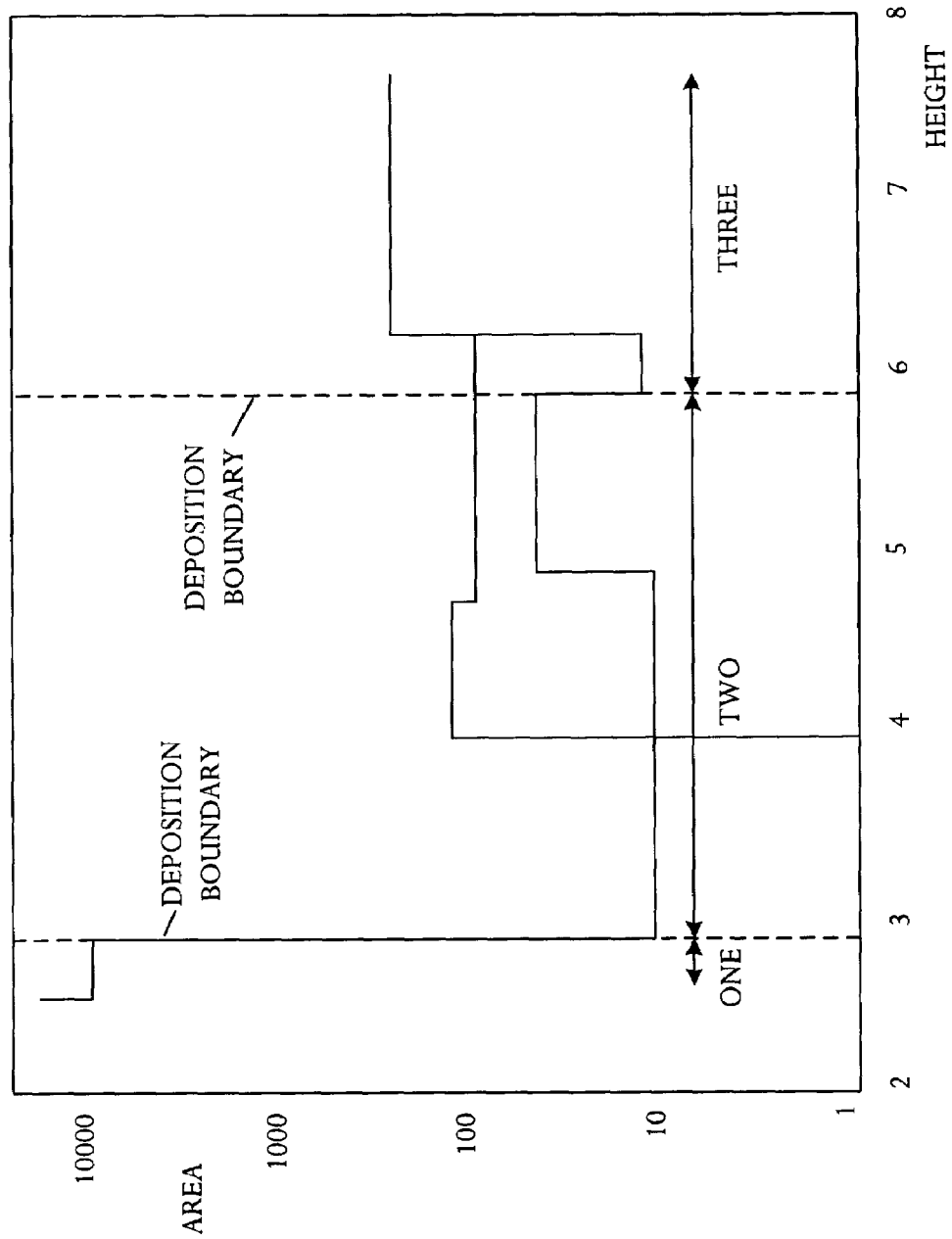
Figure 6H:
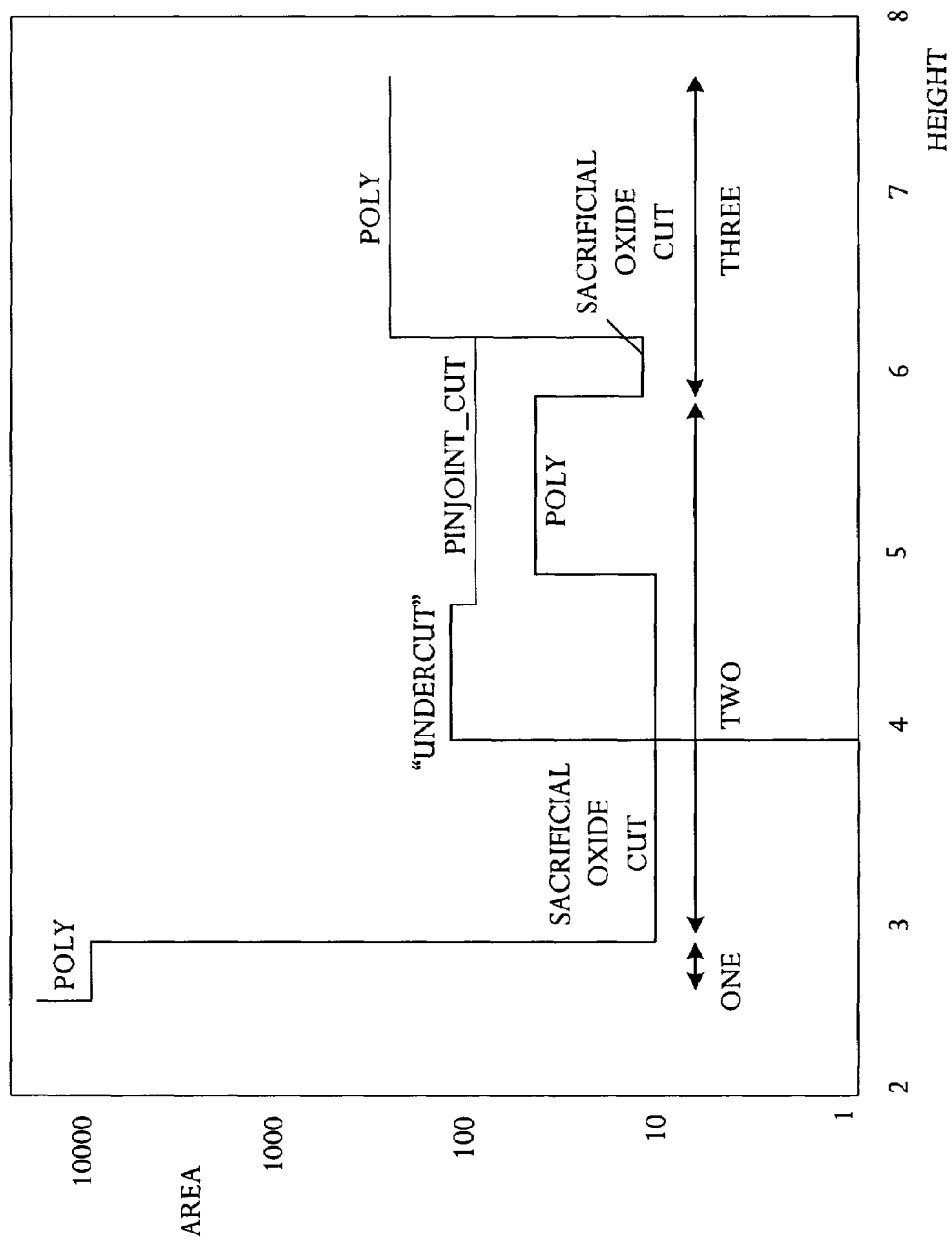

FIG. 6F is a pictorial diagram showing a hub topology 618 in side 620 and end 622 views in combination with the hub topology tree 606. The topology tree for the hub 606 is branched, and the branching is not redundant so the tree cannot be collapsed to an unbranched tree. Analysis of the nodes indicates that nodes G, K, and M are local maxima, nodes J and L are local minima, and node I is an undercut. Accordingly, a hub is created using three polysilicon masks G, K, and M, two sacrificial oxide masks J and L, and one pin joint mask I. FIG. 6G is a graph showing the deposition boundaries and domains for the hub. Local minima define the deposition boundaries. The hub has two deposition boundaries and three deposition domains, labeled as one, two, and three. FIG. 6H is a graph showing the cross-sectional area and topology of the hub masks. Local extremes define the masks. The "undercut" mask yields a pinjoint cut mask and a sacrificial oxide mask. The masks include three poly masks, two sacrificial oxide cut masks, one pin joint mask, and one sacrificial oxide mask associated with the undercut mask.

Summing the candidate mask set and reconciling the masks 608 produces the final mask set for the gear and hub object 610. Masks that are summed are those masks of the same type occurring at the same height. Summing the candidate mask sets for the gear and hub produces the mask set listed in TABLE II including relative material layer thicknesses and heights.

TABLE II

| Mask | Material Thickness | Top Height |
| --- | --- | --- |
| Poly (B, G) | 1.5 | 7.5 |
| Sacrificial Oxide LF (H) | 0.3 | 6.0 |
| Sacrificial Oxide (J) | 0.3 | 6.0 |
| Pin Joint (H) | n/a | 6.0 |
| Poly (D, K) | 1.0 | 5.7 |
| Sacrificial Oxide (L) | 2.0 | 4.7 |
| Dimple (E) | 1.5 | 4.7 |
| Poly (M) | 0.3 | 2.7 |

Reconciling the mask set of Table II with a particular set of mask constraints, specifically, Sandia Ultra-planar, Multi-level MEMS Technology 5 (SUMMIT V™) mask constraints from Sandia National Laboratories of Albuquerque, N. Mex., imposes two alterations. An example of reconciliation of the mask set is depicted in detail in Table III, as follows:

TABLE III

| Derived Process | | Actual (Summit V ™) Process | |
| --- | --- | --- | --- |
| Mask | Thickness | Mask | Thickness |
| Poly Mask (B, G) | 1.50 | MMPoly2 (B, G) | 1.50 |
| SacOx (inner B) | 0.30 | SacOx2 (inner B, J) | 0.30 |
| SacOx_Cut (J) | 0.30 | | |
| PinJoint_Cut (H) | n/a | PinJoint_Cut (H) | n/a |
| Poly Mask (D, K) | 1.00 | MMPoly1_Cut (blank) | 1.00 |
| SacOx_Cut (L) | 2.00 | SacOx1_Cut (L) | 2.00 |
| Dimple_Cut (E) | n/a | Dimple1_Cut (E) | n/a |
| Poly Mask (M) | 0.30 | MMPoly0 (M) | 0.30 |

The second and third masks are combined, first by taking the inverse of the light field mask, Sacrificial oxide Light Field (LF), and summing the inverted mask with the next sequential sacrificial oxide mask, here Sacrificial Oxide (L). The sacrificial oxide 2 cut (SacOx2_Cut) is a "drawing-only layer" and can be exclusive-ORed with the sacrificial oxide layer (Sac_Ox). Second, the Poly (D,K) mask is redundant, having an outline that is the same as Poly (B,G). Thus, the Poly 1 mask is cut with the Poly 2 mask. Summit V mask constraints allow Poly (D,K) to be excluded. Accordingly, Poly Mask (D,K) can be replaced with a blank mask. Following the two alterations, the candidate mask set meets the constraints for the Summit V™ process. The final two-dimensional mask set 610 is shown.

The described algorithm is capable of generating mask sets for complicated three-dimensional devices. The technique focuses first on topology of the three-dimensional model and can identify masks for anisotropic and isotropic, wet and dry, etching applications.

Referring again to FIGS. 4A and 4B, the usage of topology trees enables analysis of complex branched objects and devices. A particular cross section may be connected to one cross-section, multiple cross-sections, or none. Analysis is applied to each branch of the topology tree, covering the individual nodes. The analysis technique is applied to separate parts of a three-dimensional structure with the separate parts being analyzed with a separate topology tree.

Figure 7A:
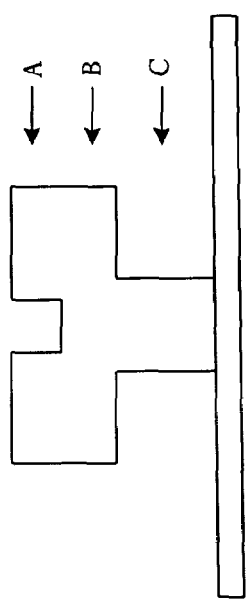
FIGS. 7A and 7B are pictorial views that depict an example of an object and identification of candidate masks in combination with FIG. 7C, a graph showing the area and height relationships of segments of the object.
Figure 7C:
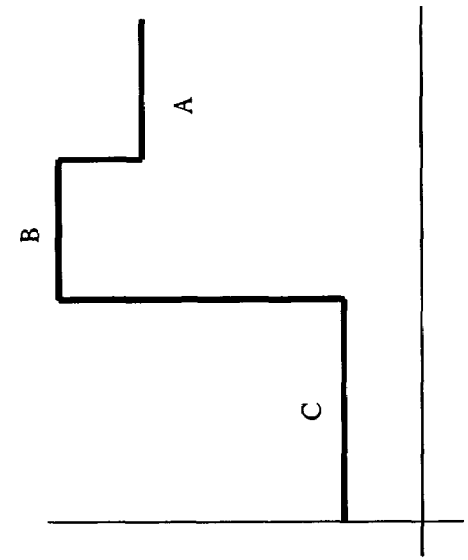
Figure 7B:
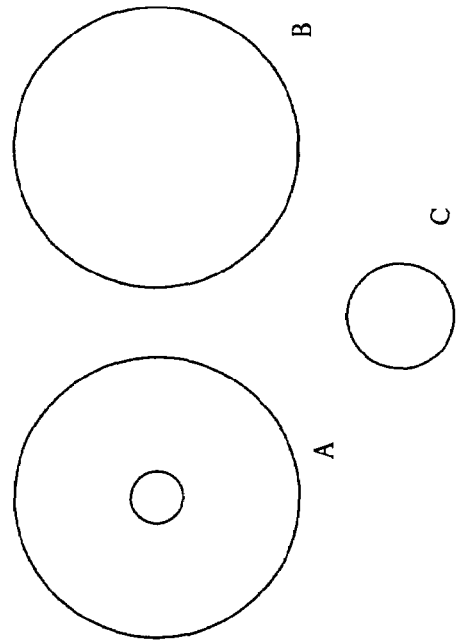

Referring to FIGS. 7A and 7B, pictorial views depict an example of an object and identification of candidate masks. FIG. 7C is a graph showing the area and height relationships of segments of the object. FIG. 7A shows a side view of the object. FIG. 7B illustrates a top view of the individual segments A, B, and C of the object. The graph shown in FIG. 7C describes the area and height of the individual segments. The masks are identified within a single deposition layer. Within a deposition layer, masks are the cross-sections at the layer top and bottom, excluding projected holes and overhangs. In practice, the minimum area utilizes a sacrificial oxide mask and a maximum area a poly mask. Deposition thickness can be calculated from the height of a cross section's location on a 3D model.

Figure 8B:
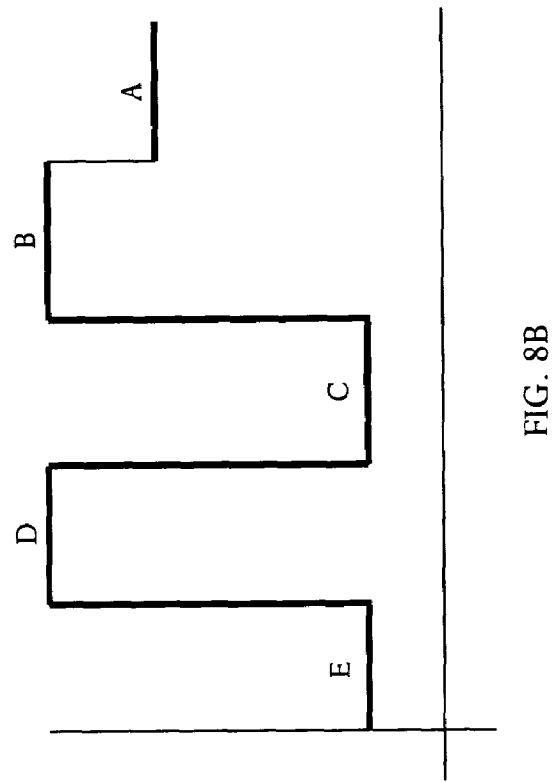
FIGS. 8A and 8B depict a pictorial diagram and a graph respectively illustrating the process of identifying deposition boundaries.
Figure 8A:
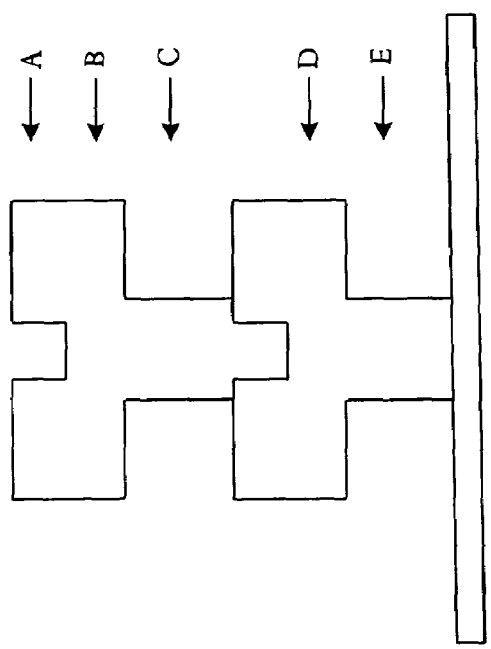

Referring to FIGS. 8A and 8B, a pictorial diagram and a graph respectively illustrate the process of identifying deposition boundaries. The deposition boundaries are defined as a node that is a local minimum. Specifically, for an area $S_n$ if $(S_n<S_{n-1})$ and $(S_n<S_{n+1})$, then the interface $S_n$, $S_{n-1}$ is defined as a deposition boundary. Accordingly, in FIGS. 8A and 8B, the interface between segments C and D is a deposition boundary. One deposition layer is between two boundaries.

Figure 9A:
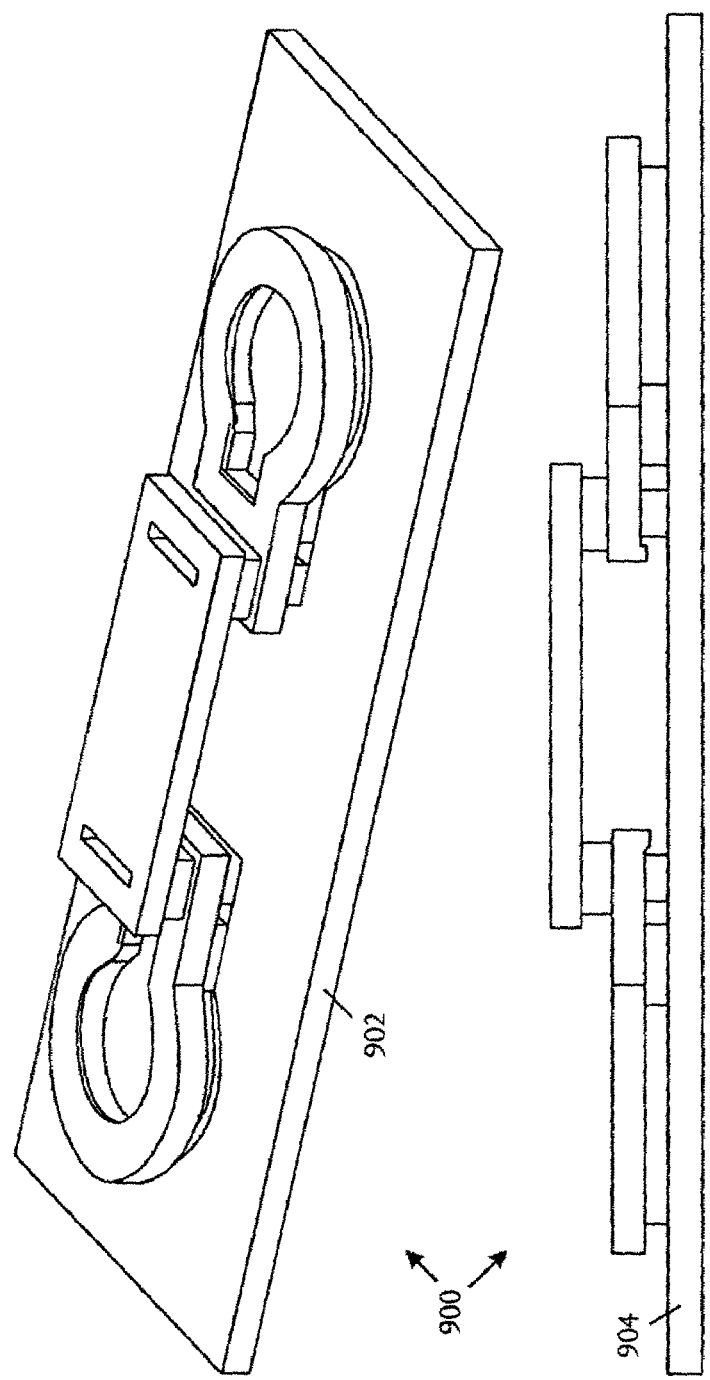
FIGS. 9A through 9E are schematic pictorial diagrams that illustrate another example of application of an automatic mask generation process embodiment.

Referring to FIGS. 9A through 9E, multiple schematic pictorial diagrams illustrate another example of application of an automatic mask generation process embodiment. FIG. 9A illustrates a perspective 902 and side 904 view of an electrical connector 900 from a standard part library that can be modeled in three dimensions by a 3D modeler. In a method of generating two-dimensional masks from a three-dimensional model the cross sectional topology of a three-dimensional body is analyzed to generate a topology tree describing connectivity and relationships between cross sections.

Figure 9B:
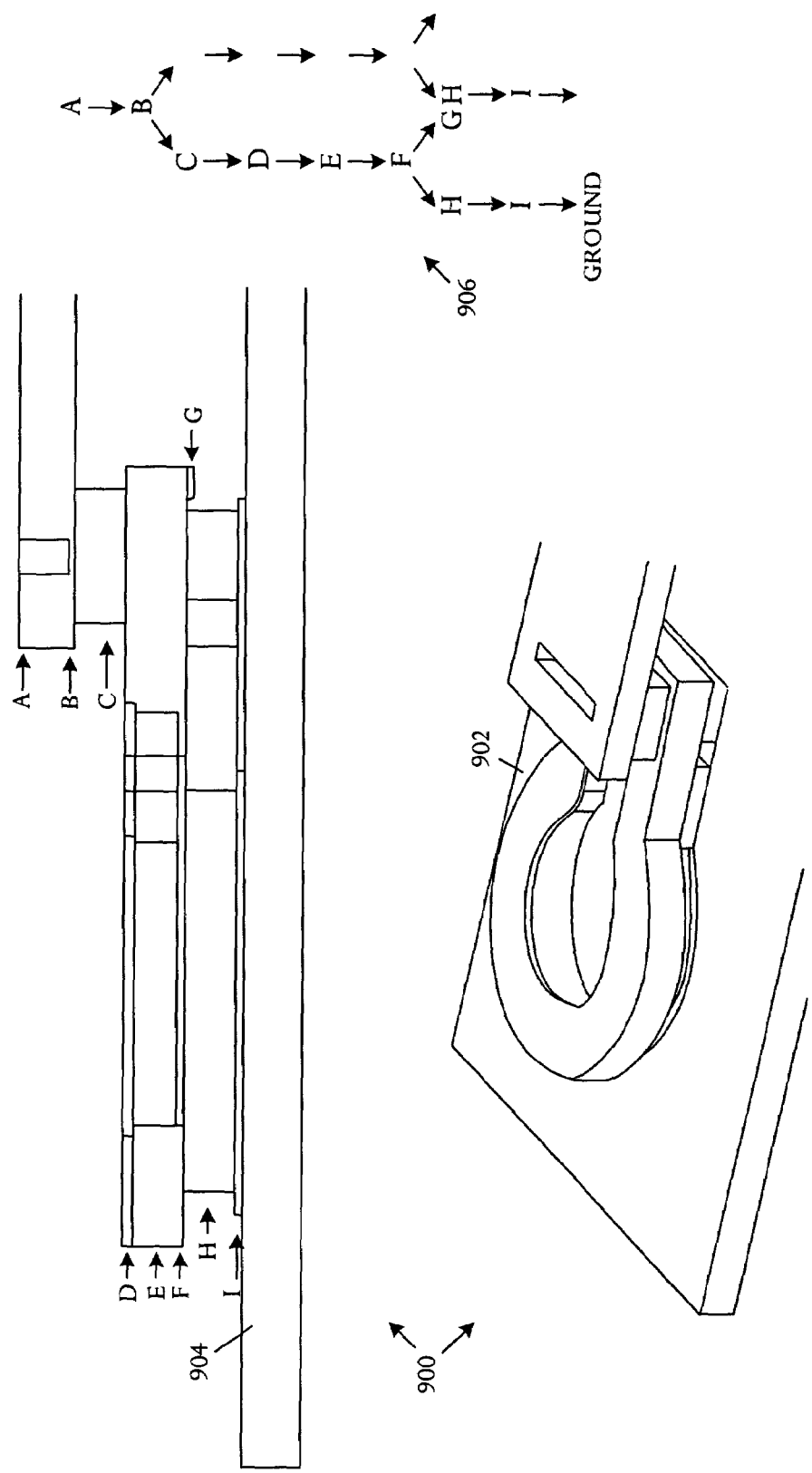

FIG. 9B shows a more detailed perspective 902 and side 904 views of the electrical connector 900, in combination with a topology tree 906 for the object. The topology tree includes one or more nodes, denoted by the letters A through G in the illustrative example, and branches connecting the nodes. For the individual nodes, the cross-sectional area is determined and the nodes are categorized relative to topological neighboring nodes.

Figure 9C:
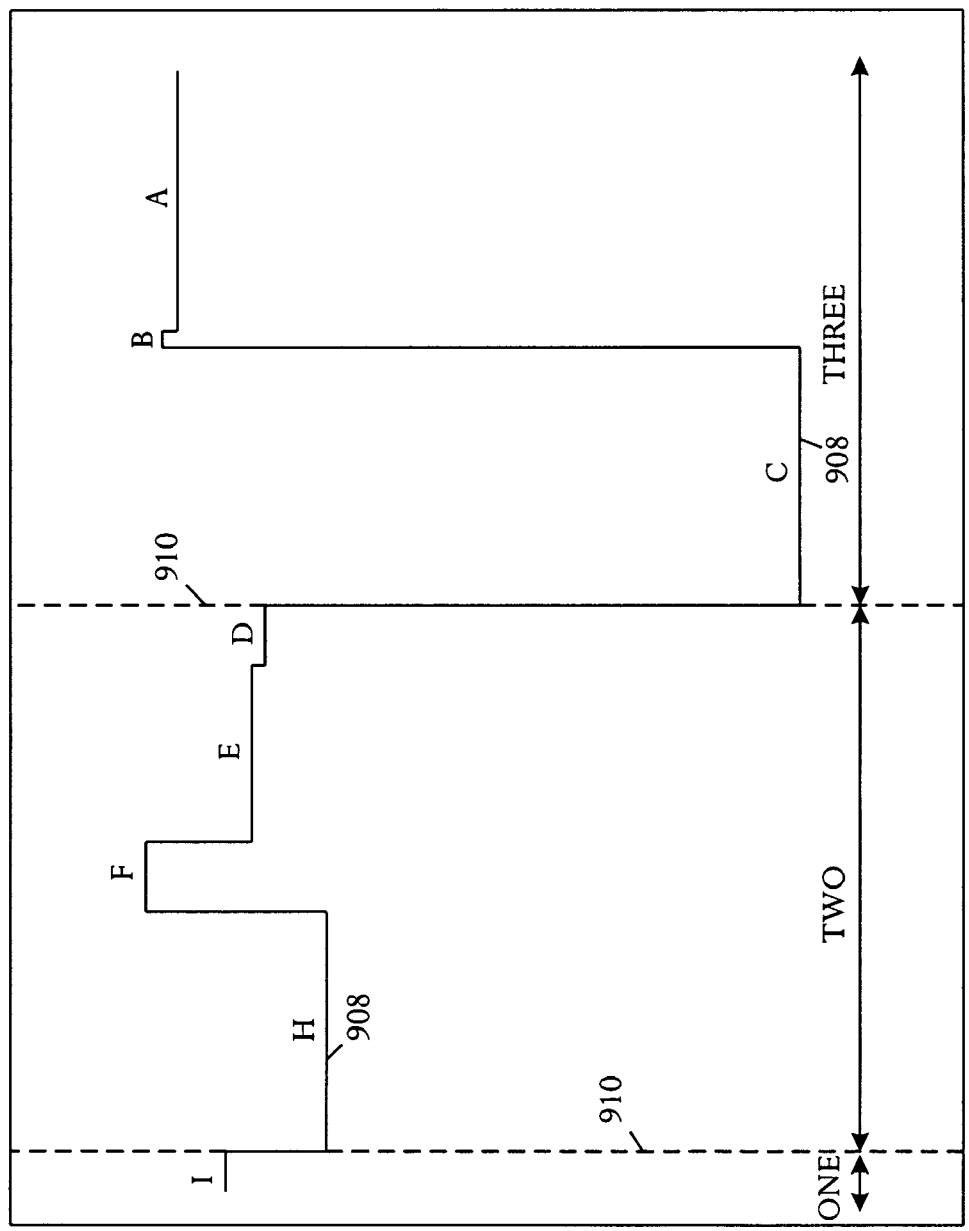

FIG. 9C is a graph that relates cross-sectional area and height above the ground plane of the nodes. The branches are processed by locating deposition boundaries to define one or more deposition domains. Local minima 908 define the deposition boundaries 910. The example has two deposition boundaries 910 separating three deposition domains, depicted as domains one, two, and three.

Figure 9D:
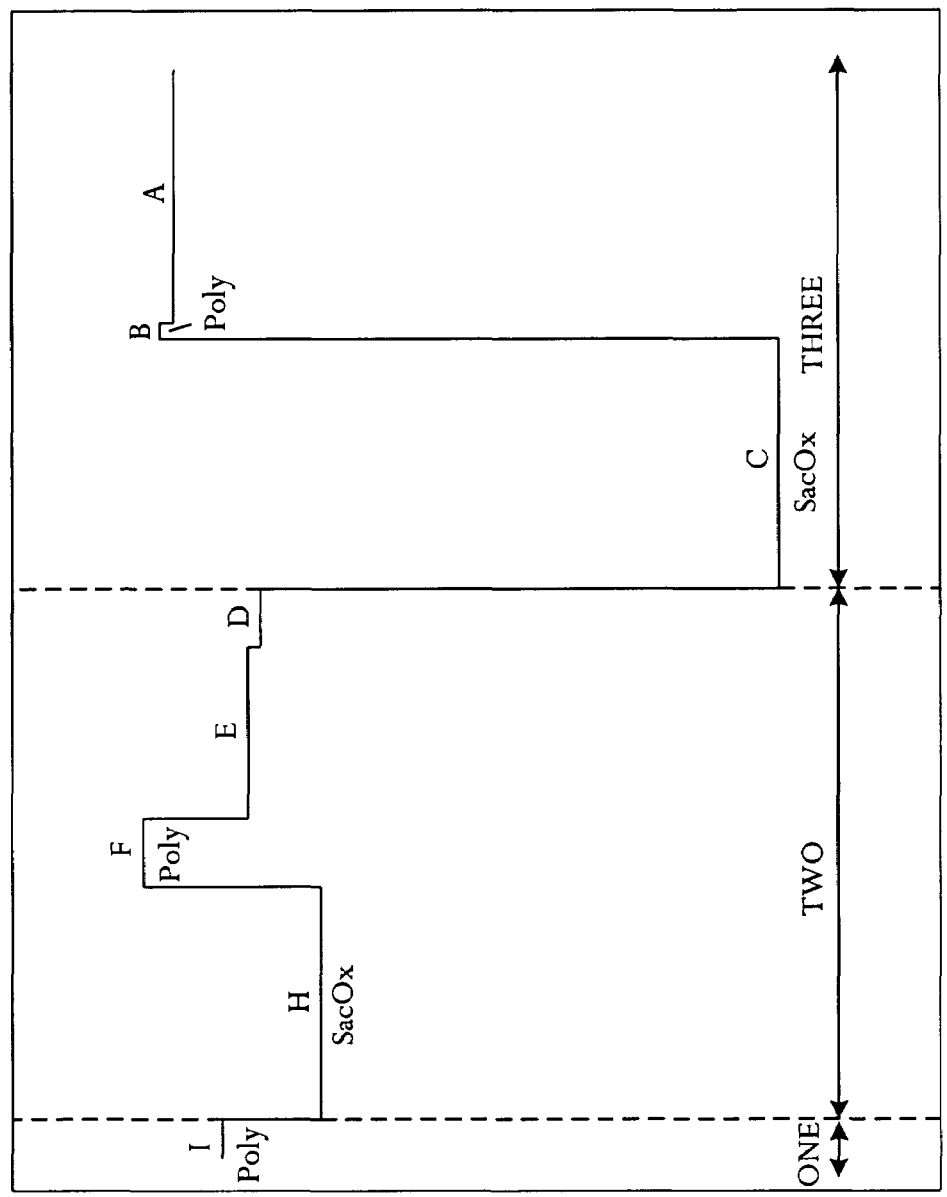
Figure 9E:
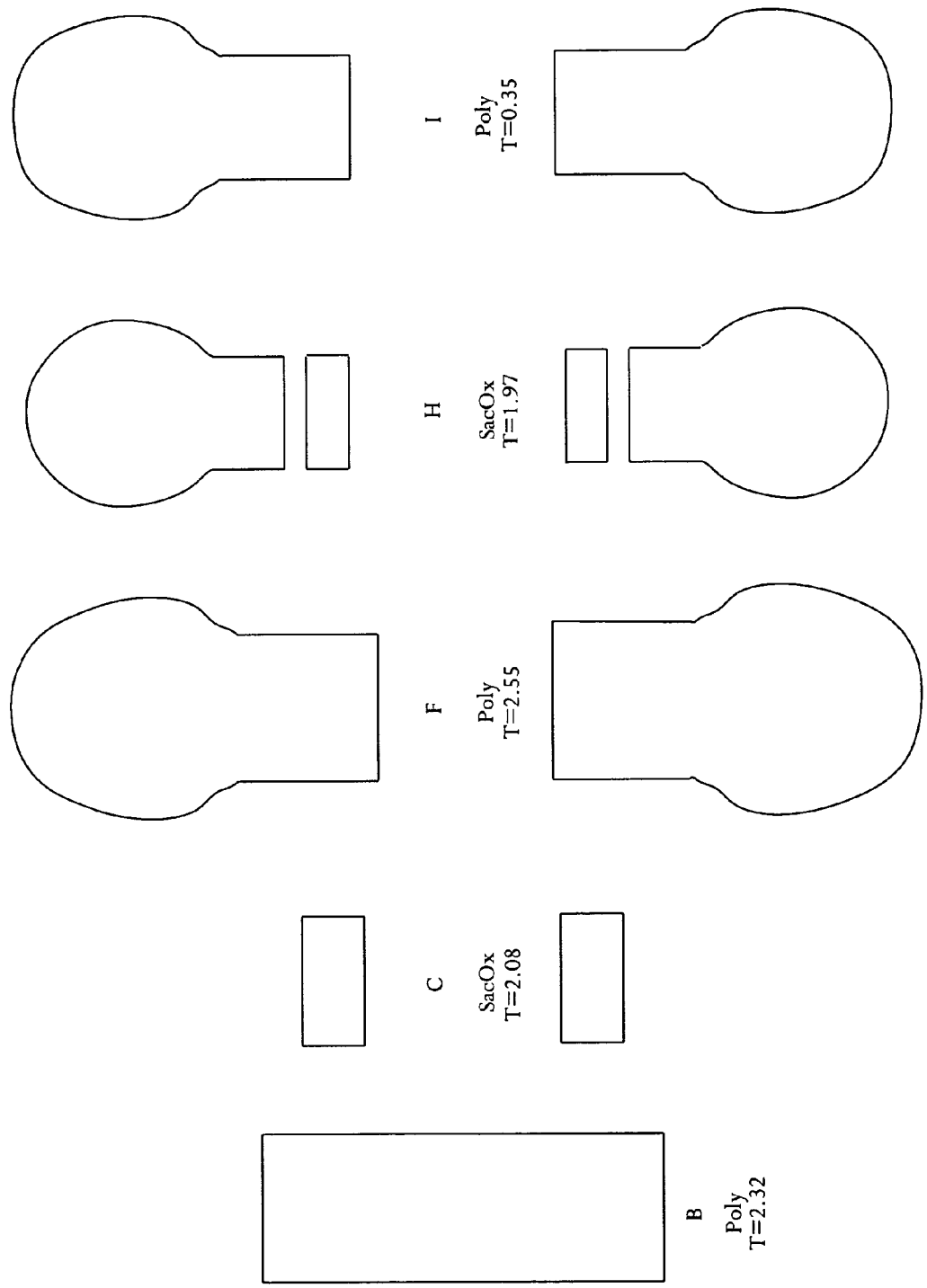

For the individual deposition domain regions between the deposition boundaries, a mask set and deposition thicknesses are defined. FIG. 9D is a graph showing the definition of masks. Within a domain, local minima are assigned a sacrificial oxide mask (SacOx) and local maxima are assigned a Poly mask. In the example, nodes B, F, and I use Poly masks. Nodes C and H are assigned SacOx masks. FIG. 9E shows a mask set for the example object.

The candidate mask set is reconciled with the SUMMIT V™ mask constraints. An example of reconciliation of the mask set is depicted in detail in Table IV, as follows:

TABLE IV

| Derived Process | | Actual (Summit V ™) Process | |
|---|---|---|---|
| Mask | Thickness | Mask | Thickness |
| Poly Mask (B) | 2.32 | MMPoly3 (B) | 2.25 |
| SacOx_Cut (C) | 2.08 | SacOx2 Cut (C) | 2.00 |
| Poly Mask (F) | 2.55 | MMPoly2 (F) | 1.50 |
|  |  | SacOx2 (blank) | 0.30 |
|  |  | MMPoly1 (blank) | 1.00 |
| SacOx_Cut (H) | 1.97 | SacOx1 (H) | 2.00 |
| Poly Mask (I) | 0.35 | MMPoly0 (I) | 0.30 |

In the example of reconciling the candidate mask set with the Summit V™ process, Summit V™ does not have an actual MMPoly1 mask. Accordingly, the Poly1 mask is cut with the Poly2 mask. The layer F is constructed with the MMPoly1 mask and the MMPoly2 mask.

The various functions, processes, methods, and operations performed or executed by the system can be implemented as programs that are executable on various types of processors, controllers, central processing units, microprocessors, digital signal processors, state machines, programmable logic arrays, and the like. The programs can be stored on any computer-readable medium for use by or in connection with any computer-related system or method. A computer-readable medium is an electronic, magnetic, optical, or other physical device or means that can contain or store a computer program for use by or in connection with a computer-related system, method, process, or procedure. Programs can be embodied in a computer-readable medium for use by or in connection with an instruction execution system, device, component, element, or apparatus, such as a system based on a computer or processor, or other system that can fetch instructions from an instruction memory or storage of any appropriate type. A computer-readable medium can be any structure, device, component, product, or other means that can store, communicate, propagate, or transport the program for use by or in connection with the instruction execution system, apparatus, or device.

The illustrative block diagrams and flow charts depict process steps or blocks that may represent modules, segments, or portions of code that include one or more executable instructions for implementing specific logical functions or steps in the process. Although the particular examples illustrate specific process steps or acts, many alternative implementations are possible and commonly made by simple design choice. Acts and steps may be executed in different order from the specific description herein, based on considerations of function, purpose, conformance to standard, legacy structure, and the like.

In an illustrative embodiment, an algorithm is implemented in a C++ program called faethm using the ACIS geometric modeling library version 11.0 and is operational with at least versions 7 through 11 (http://www.spatial.com) for import and manipulation of the three-dimensional models.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

In particular, the examples herein discuss implementations for usage with the Summit V™ process for illustrative purposes only. The methods and techniques can be used with any suitable process.

What is claimed is:

1. A method of generating two-dimensional masks from a three-dimensional model comprising:
   providing a three-dimensional model representing a micro-electro-mechanical structure for manufacture and a description of process mask requirements;
   reducing the three-dimensional model to a topological description of unique cross sections;
   selecting candidate masks from the unique cross sections and a cross section topology; and
   reconciling the candidate masks based on the description of process mask requirements to produce two-dimensional process masks.

2. The method according to claim 1 further comprising: separating the three-dimensional model into at least one independent model body.

3. The method according to claim 2 further comprising: searching the at least one independent body for the unique cross sections; and
   arranging the unique cross sections based on mutual topological relationship.

4. The method according to claim 2 further comprising: reducing the at least one independent model body to topology graphs including at least one node.

5. The method according to claim 4 further comprising: selecting the candidate masks based on structure of the topology graphs.

6. The method according to claim 4 further comprising: analyzing the topology graphs comprising:
   calculating area of a topology graph node;
   categorizing the topology graph node relative to topological neighboring nodes; and
   identifying masks according to predetermined heuristic rules.

7. The method according to claim 1 further comprising: summing the candidate masks; and
   reconciling the summed candidate masks comprising:
   performing selected operations based on process constraints, the selected operations being selected from among a group comprising: reordering, merging and splitting the summed candidate masks.

8. The method according to claim 7 wherein:
   the process constraints are selected from among a group comprising number of layers, material type of a layer, thickness of a layer, mask type, and number of masks.

9. A method of generating two-dimensional masks from a three-dimensional model comprising:
   disassembling the three-dimensional model into one or more independent bodies;
   processing individual of the one or more independent bodies comprising:
      generating a topology tree composed of one or more nodes;
      categorizing the one or more nodes of the topology tree; and
      locating deposition boundaries to define one or more deposition domains;
   processing individual of the one or more deposition domains comprising:
      locating candidate masks; and
      saving the candidate masks in a candidate mask set; and
   summing, the candidate masks in the candidate mask set.

10. The method according to claim 9 further comprising: providing the three-dimensional model that represents a micro-electro-mechanical structure for manufacture.

11. The method according to claim 9 wherein:
    processing individual of the one or more independent bodies further comprises:
       combining redundant nodes.

12. The method according to claim 9 further comprising: for a model that cannot be produced within constraints of a specified process or no particular process is specified, defining process steps that are capable of producing the model.

13. The method according to claim 9 further comprising: supplying the three-dimensional model with a specific manufacturing process for production of a device corresponding to a model undefined; and
    generating a process description for a manufacturing process capable of producing the device in combination with production of the two-dimensional masks.

14. The method according to claim 9 further comprising: reconciling the candidate masks in the candidate mask set with target process constraints.

15. The method according to claim 14 wherein:
    reconciling the candidate masks comprises inverting etching sense of a candidate mask to meet a target process constraint.

16. The method according to claim 14 wherein:
    reconciling the candidate masks comprises dividing candidate mask layers that are thicker than layers determined by the target process constraints and placing a sacrificial oxide mask identical to the divided candidate mask between the divided candidate mask layers.

17. The method according to claim 14 wherein:
    reconciling the candidate masks comprises rearranging order of the candidate masks for a target process that an arrangement does not change result.

18. A method of generating two-dimensional masks from a three-dimensional model comprising:
    analyzing cross sectional topology of a three-dimensional body;
    generating a topology tree describing connectivity and relationships between cross sections, the topology tree including one or more nodes and branches connecting the one or more nodes;
    processing individual of the one or more nodes comprising:
       calculating a cross sectional area of the individual of the one or more nodes; and
       categorizing the individual of the one or more nodes relative to topological neighboring nodes;
    processing individual of the one or more branches comprising:
       locating deposition boundaries to define one or more deposition domains; and
    processing individual deposition domain regions between the deposition boundaries comprising:
       defining a mask set and deposition thickness.

19. The method according to claim 18 further comprising: identifying independent three-dimensional bodies in the three-dimensional model;
    processing individual of the independent three-dimensional bodies; and summing the mask sets for the processed independent three-dimensional bodies.

20. The method according to claim 19 further comprising: reconciling the mask sets with target mask process constraints.

21. The method according to claim 19 further comprising: joining redundant nodes of the processed individual of the one or more nodes.

22. An article of manufacture comprising:
a controller usable medium having a computable readable program code embodied therein for generating two-dimensional masks from a three-dimensional model, the computable readable program code fuser comprising:
   a code capable of causing the controller to access information relating to a three-dimensional model representing a micro-electro-mechanical structure for manufacture and a description of process mask requirements;
   a code capable of causing the controller to reduce the three-dimensional model to a topological description of unique cross sections;
   a code capable of causing the controller to select candidate masks from the unique cross sections and a cross section topology; and
   a code capable of causing the controller to reconcile the candidate masks based on the description of process mask requirements to produce two-dimensional process masks.

23. The article of manufacture according to claim 22 further comprising:
   a code capable of causing the controller to separate the three-dimensional model into at least one independent model body;
   a code capable of causing the controller to search the at least one independent body for unique cross sections; and
   a code capable of causing the controller to arrange the cross sections based on mutual topological relationship.

24. The article of manufacture according to claim 22 further comprising:
   a code capable of causing the controller to separate the three-dimensional model into at least one independent model body;
   a code capable of causing the controller to reduce the at least one independent model body to topology graphs including at least one node; and
   a code capable of causing the controller to select the candidate masks based on structure of the topology graphs.

25. The article of manufacture according to claim 22 further comprising:
   a code capable of causing the controller to separate the three-dimensional model into at least one independent model body;
   a code capable of causing the controller to reduce the at least one independent model body to topology graphs including at least one node; and
   a code capable of causing the controller to analyze the topology graphs comprising:
      a code capable of causing the controller to calculate area of a topology graph node;
      a code capable of causing the controller to categorize the topology graph node relative to topological neighboring nodes; and
      a code capable of causing the controller to identify masks according to predetermined heuristic rules.

26. The article of manufacture according to claim 22 further comprising:
   a code capable of causing the controller to sun the candidate masks; and
   a code capable of causing the controller to reconcile the summed candidate masks comprising:
      a code capable of causing the controller to perform selected operations based on process constraints, the selected operations being selected from among a group comprising: reordering, merging and splitting the summed candidate masks.

27. An article of manufacture comprising:
a controller usable medium having a computable readable program code embodied therein for generating two-dimensional masks from a three-dimensional model that represents a micro-electro-mechanical structure for manufacture, the computable readable program code further comprising:
   a code capable of causing the controller to disassemble the three-dimensional model into one or more independent bodies;
   a code capable of causing the controller to process individual of the one or more independent bodies comprising:
      a code capable of causing the controller to generate a topology tree composed of one or more nodes;
      a code capable of causing the controller to categorize the one or more nodes of the topology tree; and
      a code capable of causing the controller to locate deposition boundaries to define one or more deposition domains;
   a code capable of causing the controller to process individual of the one or more deposition domains comprising:
      a code capable of causing the controller to locate candidate masks; and
      a code capable of causing the controller to save masks in a candidate mask set; and
   a code capable of causing the controller to sum the candidate masks in the candidate mask set.

28. The article of manufacture according to claim 27 further comprising:
   a code capable of causing the controller to combine redundant nodes in the code capable of causing the controller to process individual of the one or more independent bodies.

29. The article of manufacture according to claim 27 further comprising;
   a code capable of causing the controller to reconcile the candidate masks in the candidate mask set with target process constraints.

30. An article of manufacture comprising;
a controller usable medium having a computable readable program code embodied therein for generating two-dimensional masks from a three-dimensional model that represents a micro-electro-mechanical structure for manufacture, the computable readable program code further comprising:
   a code capable of causing the controller to analyze cross sectional topology of a three-dimensional body;
   a code capable of causing the controller to generate a topology tree describing connectivity and relationships between cross sections, the topology tree including one or more nodes and branches connecting the one or more nodes;

a code capable of causing the controller to process
individual of the one or more nodes comprising:
a code capable of causing the controller to calculate
a cross sectional area of the individual of the one
or more nodes; and
a code capable of causing the controller to categorize
the individual of the one or more nodes relative to
topological neighboring nodes;
a code capable of causing the controller to process
individual of the one or more branches comprising:
a code capable of causing the controller to locate
deposition boundaries to define one or more deposition domains; and
a code capable of causing the controller to process
individual deposition domain regions between the
deposition boundaries comprising:
a code capable of causing the controller to define
a mask set and deposition thickness.

31. The article of manufacture according to claim 30 further comprising:
a code capable of causing the controller to identify
independent three-dimensional bodies in the three-dimensional model;
a code capable of causing the controller to process individual of the independent three-dimensional bodies;
a code capable of causing the controller to sum the mask sets for the processed independent three-dimensional bodies;
a code capable of causing the controller to reconcile the mask sets with target mask process constraints; and
a code capable of causing the controller to join redundant nodes of the processed individual of the one or more nodes.

32. An apparatus for generating two-dimensional masks from a three-dimensional model comprising:
means for providing a three-dimensional model representing a micro-electro-mechanical structure for manufacture and a description of process mask requirements;
means for reducing the three-dimensional model to a topological description of unique cross sections;
means for selecting candidate masks from the unique cross sections and a cross section topology; and
means for reconciling the candidate masks based on the description of process mask requirements to produce two-dimensional process masks.

* * * * *